US012622285B2

(12) United States Patent
Ishino et al.

(10) Patent No.: US 12,622,285 B2
(45) Date of Patent: May 5, 2026

(54) SEMICONDUCTOR MODULE AND METHOD FOR MANUFACTURING SEMICONDUCTOR MODULE

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Hiroshi Ishino, Nisshin (JP); Katsuya Kumagai, Nisshin (JP); Masaru Narikawa, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 544 days.

(21) Appl. No.: 18/181,679

(22) Filed: Mar. 10, 2023

(65) Prior Publication Data

US 2023/0378031 A1     Nov. 23, 2023

(30) Foreign Application Priority Data

May 19, 2022    (JP) ................................. 2022-082426

(51) Int. Cl.
*H01L 23/495*        (2006.01)
*H01L 23/00*         (2006.01)
*H01L 23/31*         (2006.01)

(52) U.S. Cl.
CPC .... *H01L 23/49555* (2013.01); *H01L 23/3107* (2013.01); *H01L 24/32* (2013.01);
(Continued)

(58) Field of Classification Search
CPC ........... H01L 23/49555; H01L 23/3107; H01L 24/32; H01L 24/48; H01L 24/73;
(Continued)

(56) References Cited

U.S. PATENT DOCUMENTS 6,657,298 B1 *  12/2003  Glenn ................... H01L 21/565
                                                       257/730
2005/0260795 A1 *  11/2005  Park ........................ H01L 24/97
                                                       257/E23.037
(Continued)

FOREIGN PATENT DOCUMENTS

JP          2016-195224 A      11/2016

OTHER PUBLICATIONS

U.S. Appl. No. 18/181,618, filed Mar. 10, 2023, Kuwata et al.

*Primary Examiner* — Teresa M. Arroyo
(74) *Attorney, Agent, or Firm* — Posz Law Group, PLC

(57)            ABSTRACT

A semiconductor module includes a semiconductor chip, a resin molded part, and a connection terminal electrically connected to the semiconductor chip. The connection terminal includes an internal terminal sealed in the resin molded part, an external terminal, and a tie bar remaining portion. The internal terminal is extended in a first direction and exposed from an opening portion of the resin molded part. The external terminal is connected to the internal terminal through the opening portion, and projected outside the resin molded part. The tie bar remaining portion extends from the internal terminal in a second direction intersecting the first direction and projects outside the resin molded part to provide a tie bar projecting portion. The connection terminal has a groove portion covered with the resin molded part, between an exposed portion of the internal terminal and the tie bar projecting portion.

9 Claims, 17 Drawing Sheets

(52) U.S. Cl.
    CPC .............. *H01L 24/48* (2013.01); *H01L 24/73*
         (2013.01); *H01L 2224/32245* (2013.01); *H01L*
              *2224/48247* (2013.01); *H01L 2224/73265*
                   (2013.01); *H01L 2924/182* (2013.01)
(58) Field of Classification Search
    CPC . H01L 2224/32245; H01L 2224/48247; H01L
              2224/73265; H01L 2924/182; H01L
         23/49517; H01L 23/49537; H01L 21/565;
              H01L 23/49541; H01L 23/49548; H01L
         23/49562; H01L 23/49575; H01L 23/293;
                        H01L 21/56; H01L 23/49
    See application file for complete search history.

(56) References Cited

U.S. PATENT DOCUMENTS

| | | | |
|---|---|---|---|
| 2008/0067640 A1 * | 3/2008 | Do | H01L 23/49541 |
| | | | 257/E23.039 |
| 2016/0207148 A1 | 7/2016 | Kobayashi et al. | |
| 2019/0355656 A1 | 11/2019 | Hayashi et al. | |
| 2021/0257269 A1 | 8/2021 | Taniguchi | |
| 2022/0081283 A1 | 3/2022 | Hochi et al. | |
| 2022/0415765 A1 | 12/2022 | Ishino et al. | |

\* cited by examiner

1st DIRECTION

2nd DIRECTION

1st DIRECTION ◄————► 2nd DIRECTION

1st DIRECTION ◄————► 2nd DIRECTION

1

SEMICONDUCTOR MODULE AND METHOD FOR MANUFACTURING SEMICONDUCTOR MODULE

CROSS REFERENCE TO RELATED APPLICATION

The present application claims the benefit of priority from Japanese Patent Application No. 2022-082426 filed on May 19, 2022. The entire disclosures of the above application are incorporated herein by reference.

TECHNICAL FIELD

The present disclosure relates to a semiconductor module and a method for manufacturing a semiconductor module.

BACKGROUND

There has been proposed a semiconductor module including a semiconductor element, a connection terminal connected to the semiconductor element, and a resin molded part integrally sealing the semiconductor element and the connection terminal.

Such a semiconductor module may be manufactured as follows. That is, a terminal constituent member in which the connection terminal is connected to another member through a tie bar is prepared, and the connection terminal of the terminal constituent member is electrically connected to a semiconductor element, thereby to produce a component member. Next, the component member is placed in a mold such that the tie bar is held by the mold. Subsequently, a molten resin is injected into the mold and solidified, thereby to form the resin molded part. Thereafter, the tie bar is cut.

SUMMARY

The present disclosure describes a semiconductor module, which is capable of suppressing damage to a resin molded part. According to an aspect of the present disclosure, a semiconductor module may include a semiconductor chip, a resin molded part, and a connection terminal electrically connected to the semiconductor chip. The connection terminal may include an internal terminal sealed in the resin molded part, an external terminal, and a tie bar remaining portion. The internal terminal may be extended in a first direction and exposed from an opening portion of the resin molded part. The external terminal may be connected to the internal terminal through the opening portion, and projected outside the resin molded part. The tie bar remaining portion may extend from the internal terminal in a second direction intersecting the first direction and project outside the resin molded part to provide a tie bar projecting portion. The connection terminal may have a groove portion covered with the resin molded part, between an exposed portion of the internal terminal and the tie bar projecting portion. The present disclosure also describes a method for manufacturing such a semiconductor module.

BRIEF DESCRIPTION OF THE DRAWINGS

Objects, features and advantages of the present disclosure will become more apparent from the following detailed description made with reference to the accompanying drawings, in which like parts are designated by like reference numbers and in which:

2

Figure 1:
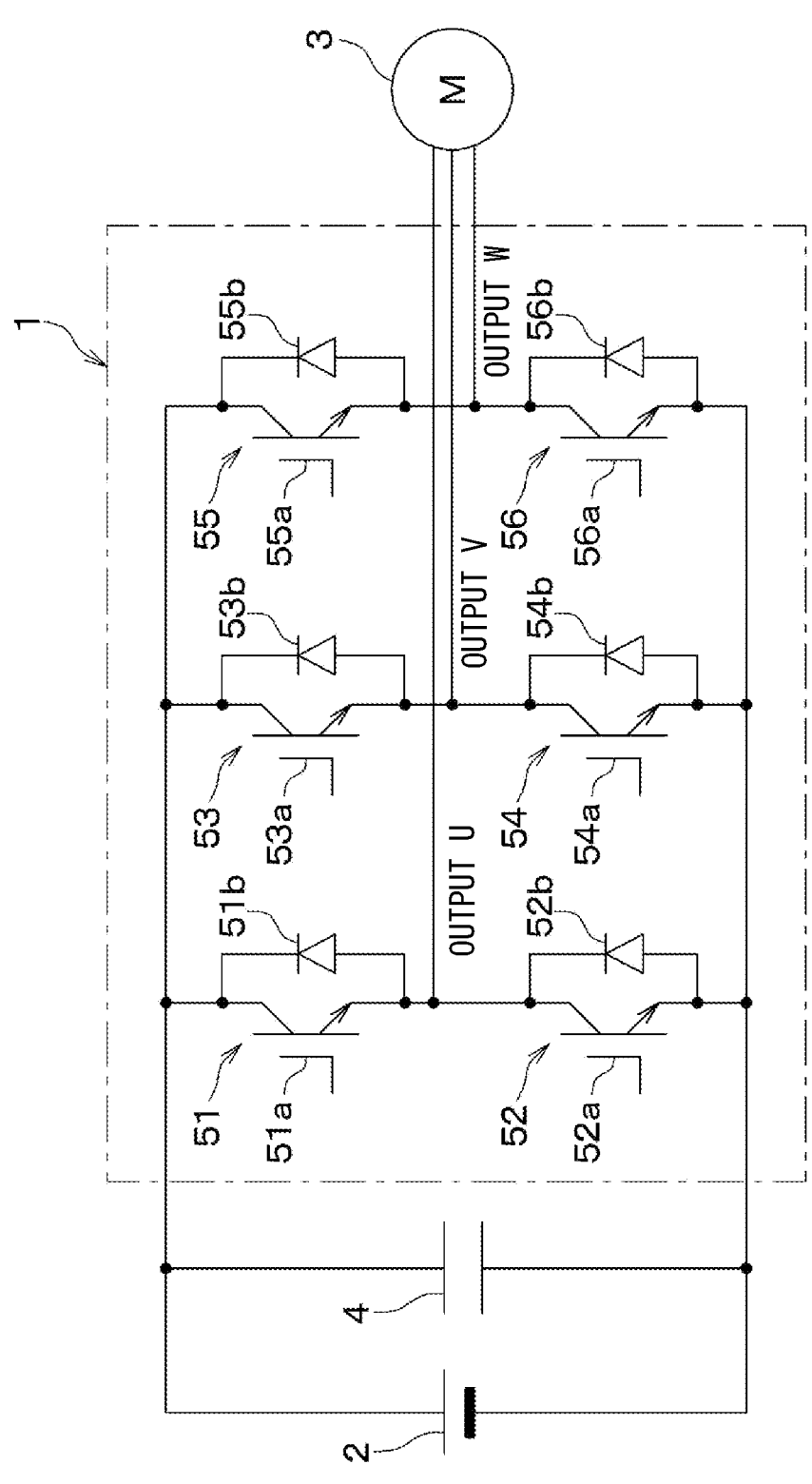
Figure 2:
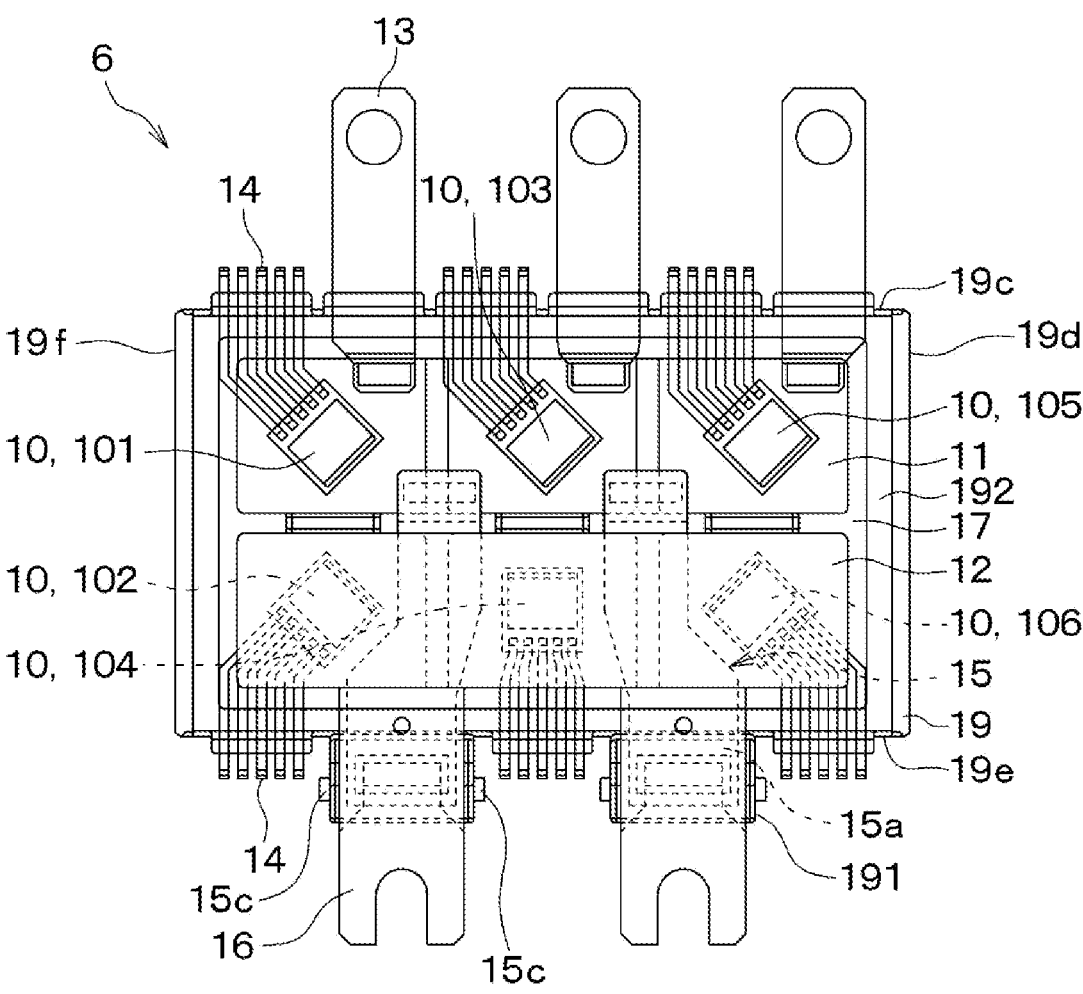
Figure 3:
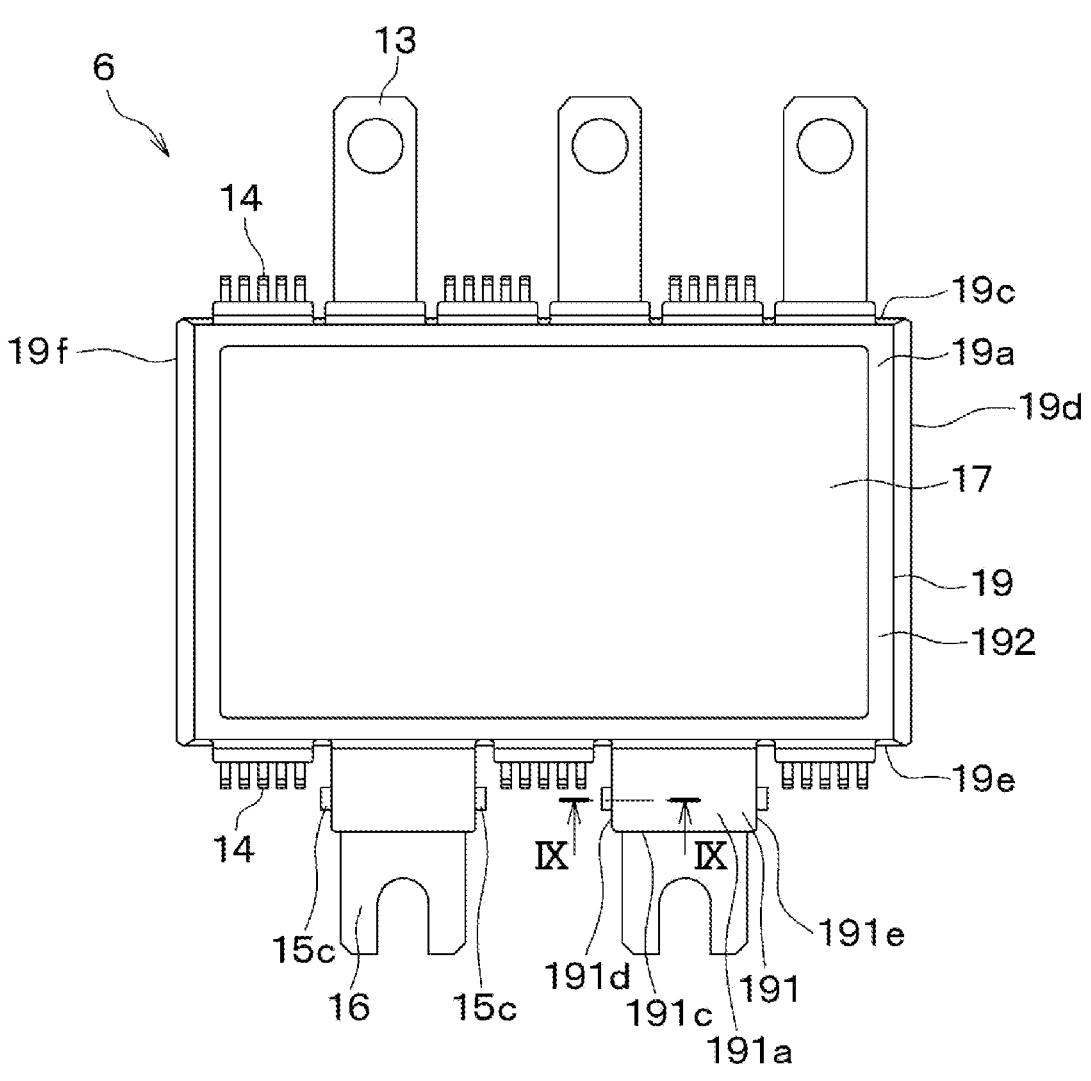
Figure 4:
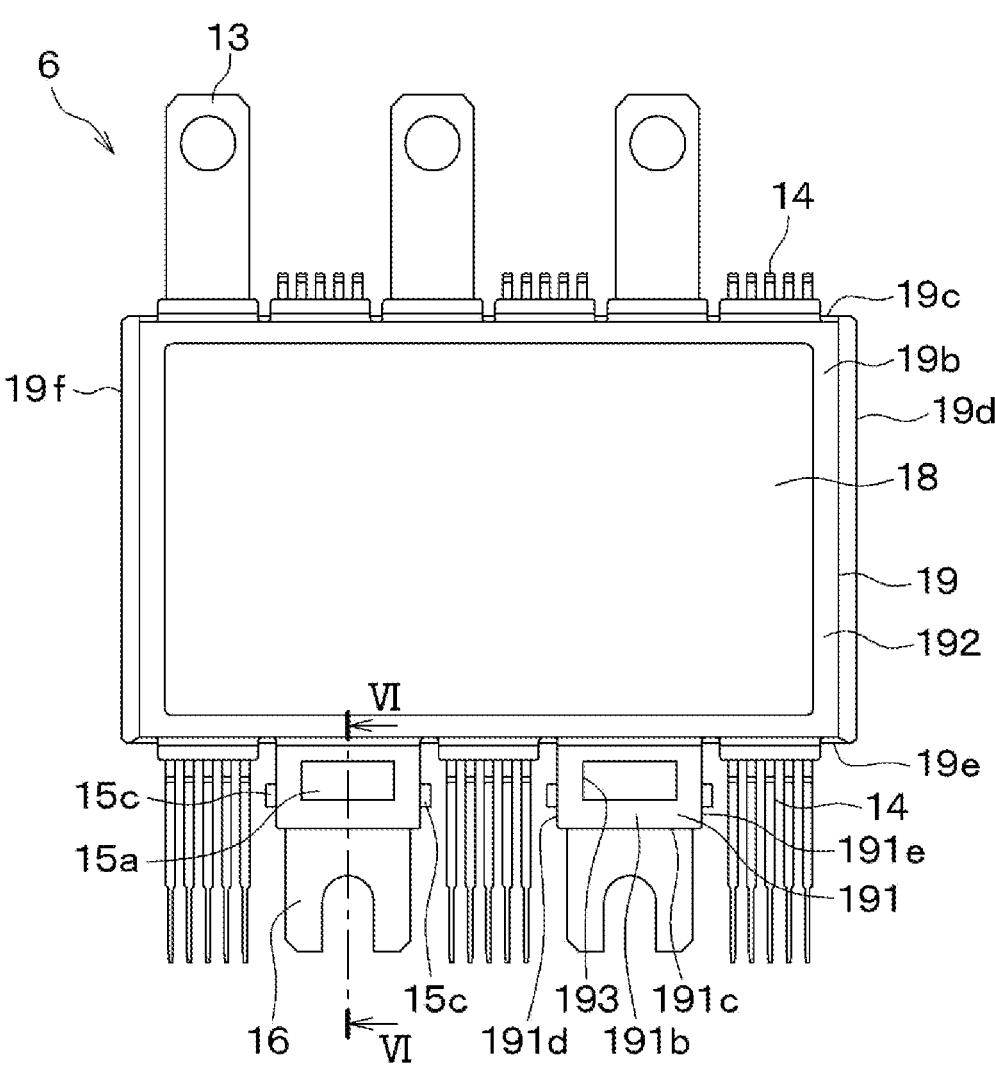
Figure 5:
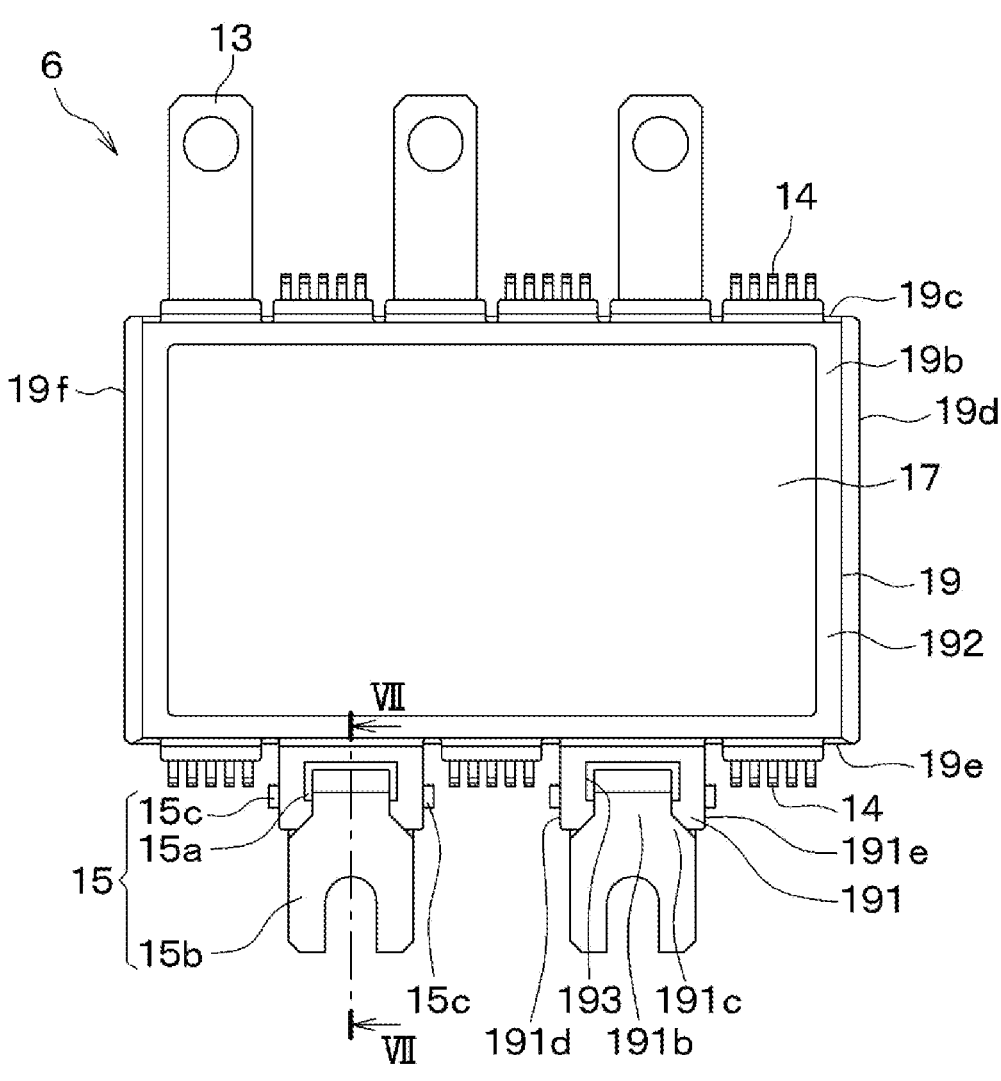
Figure 6:
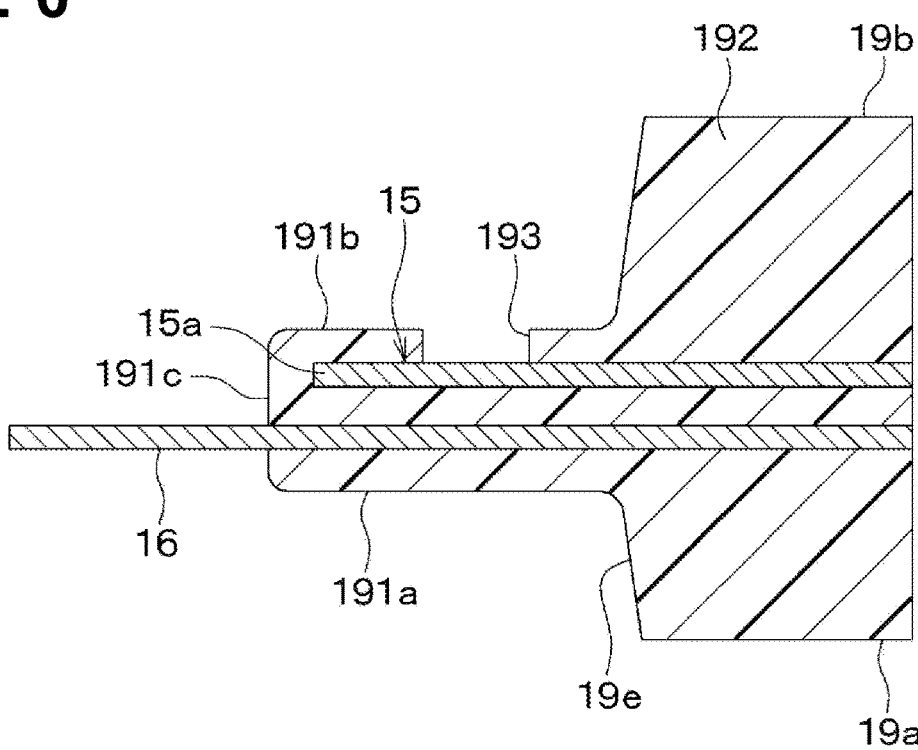
Figure 7:
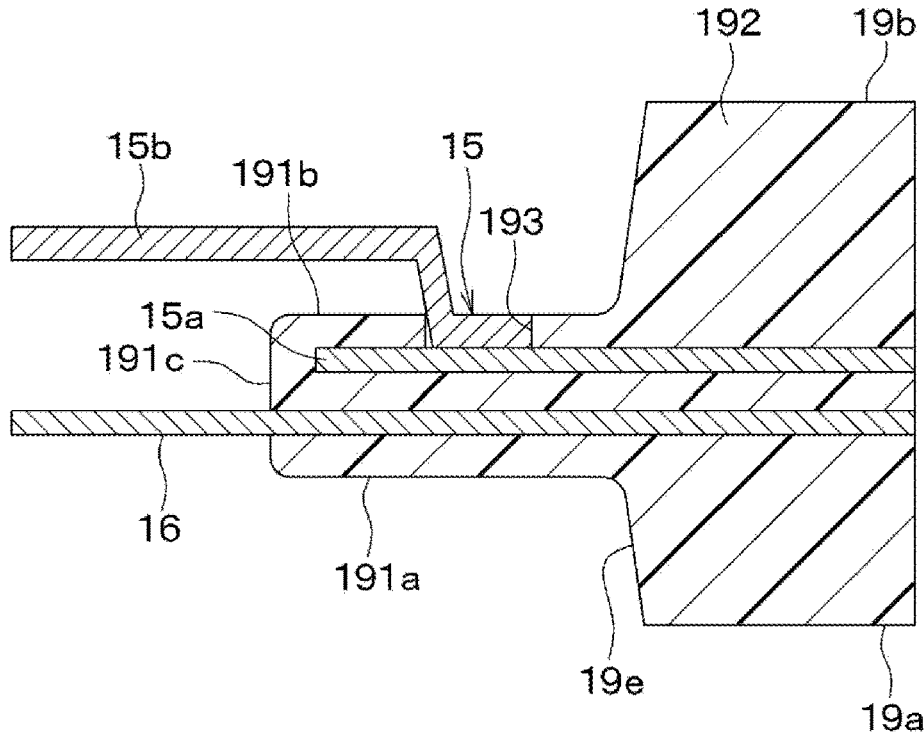
Figure 8:
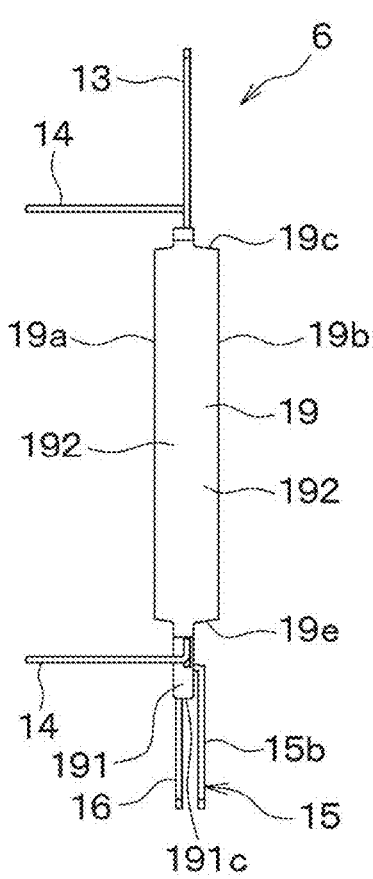
Figure 9:
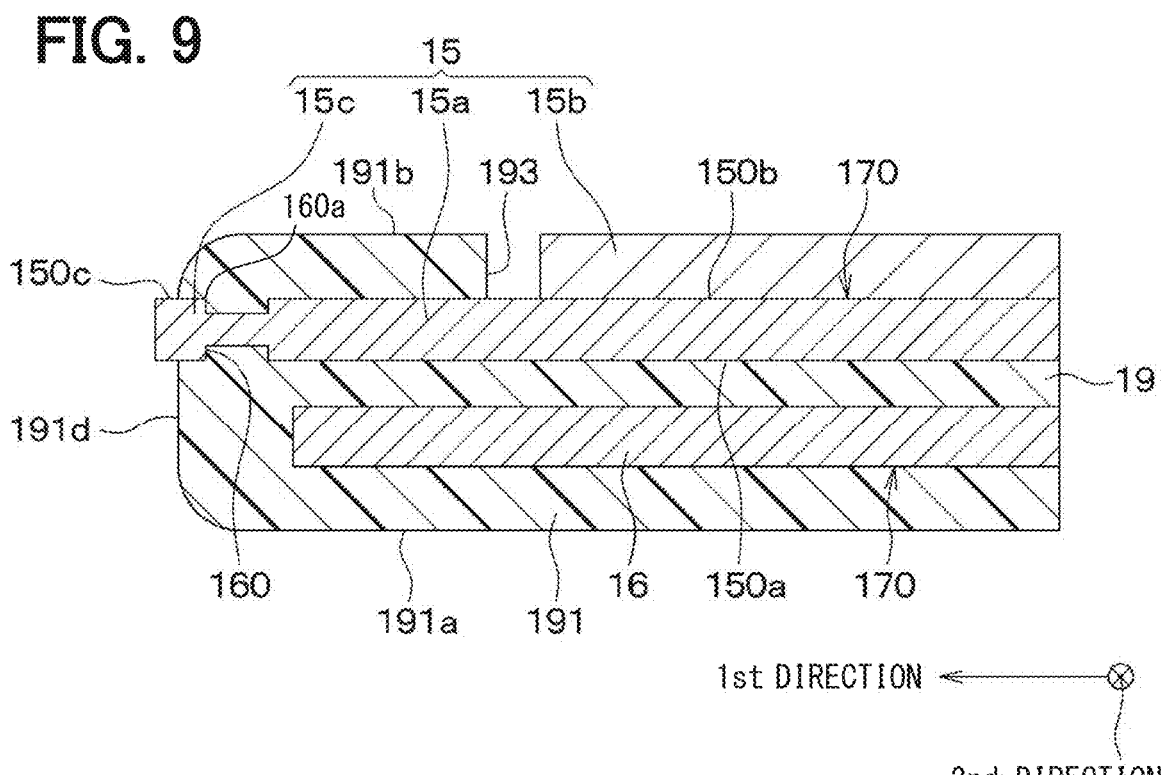
Figure 10:
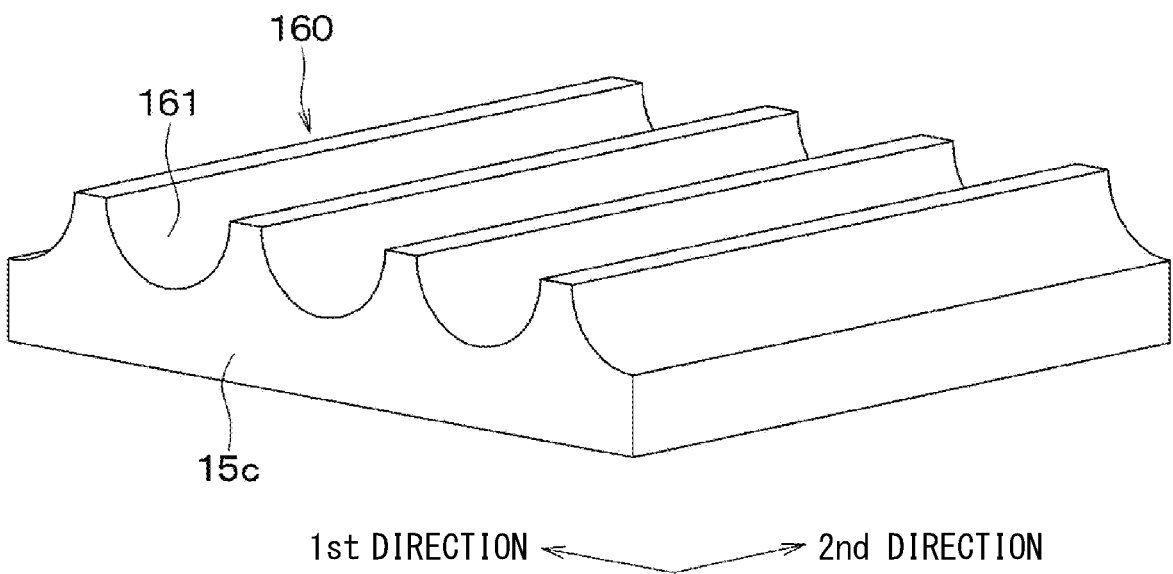
Figure 11:
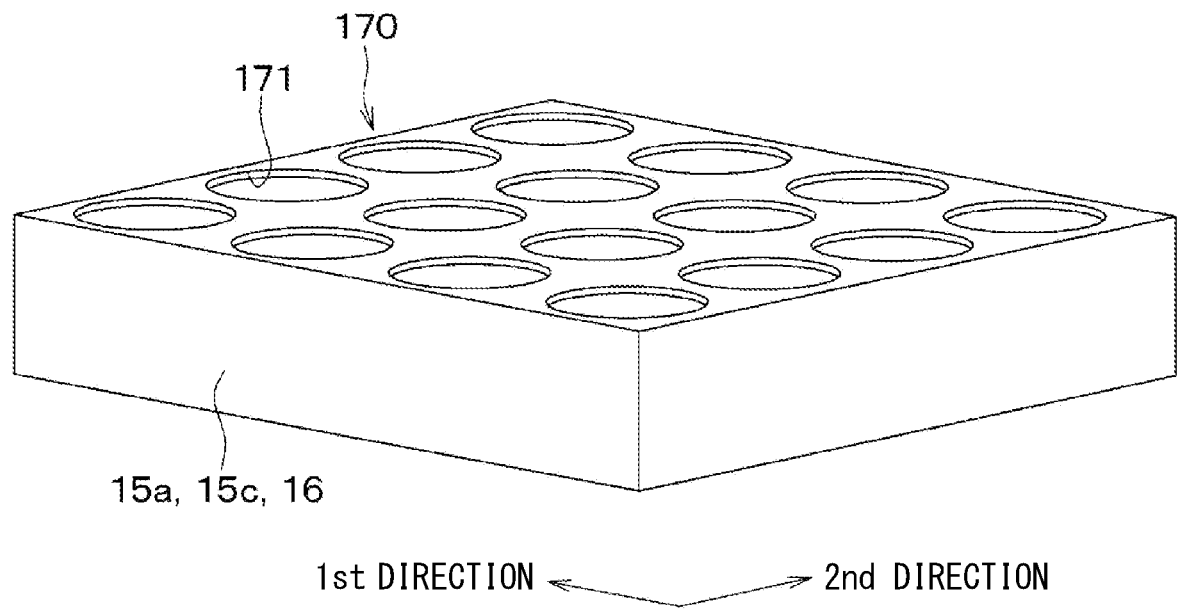
Figure 12:
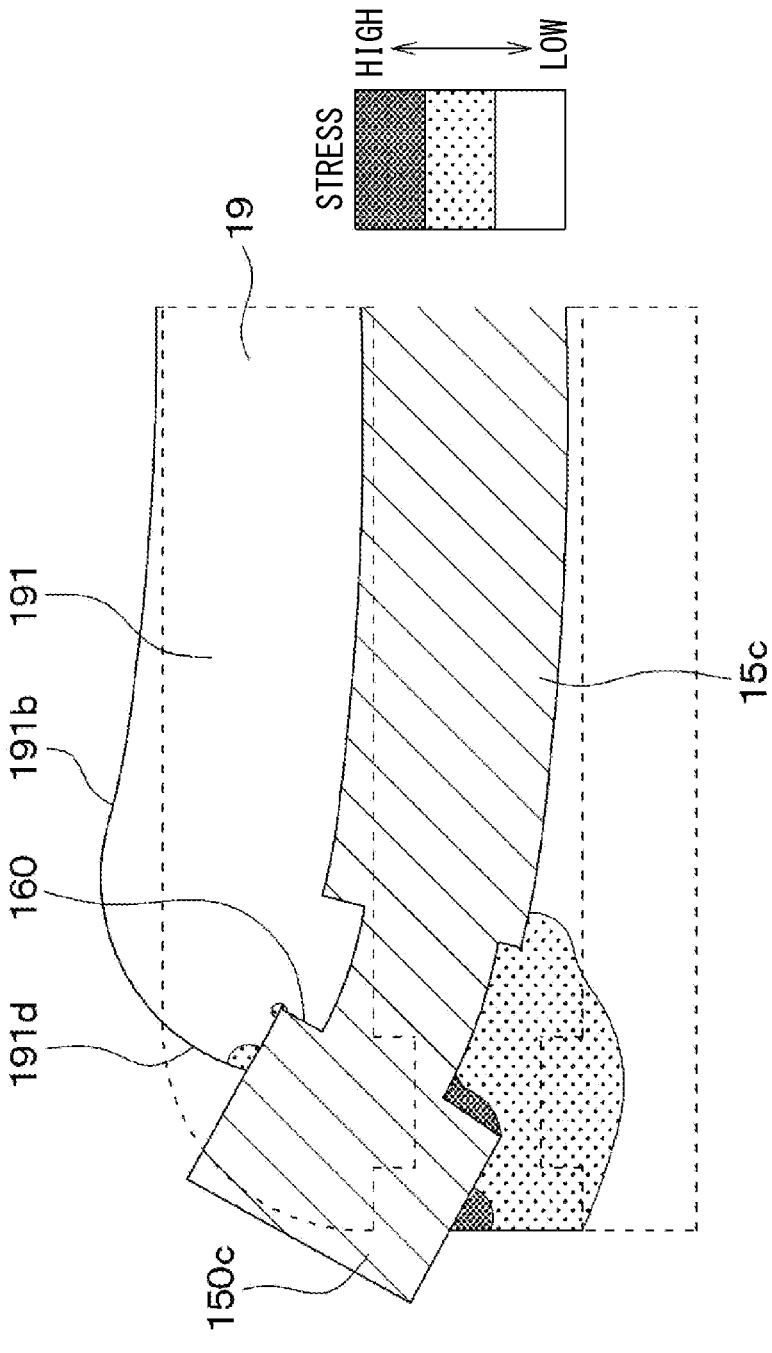
Figure 13A:
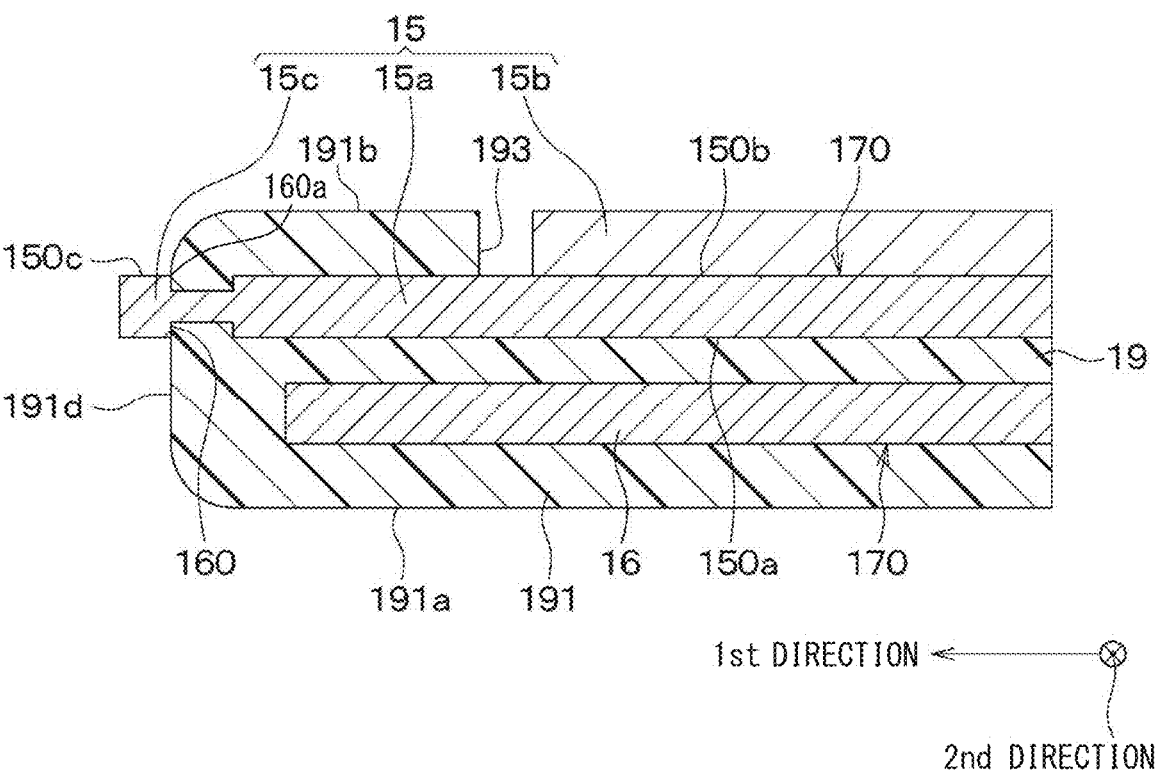
Figure 13B:
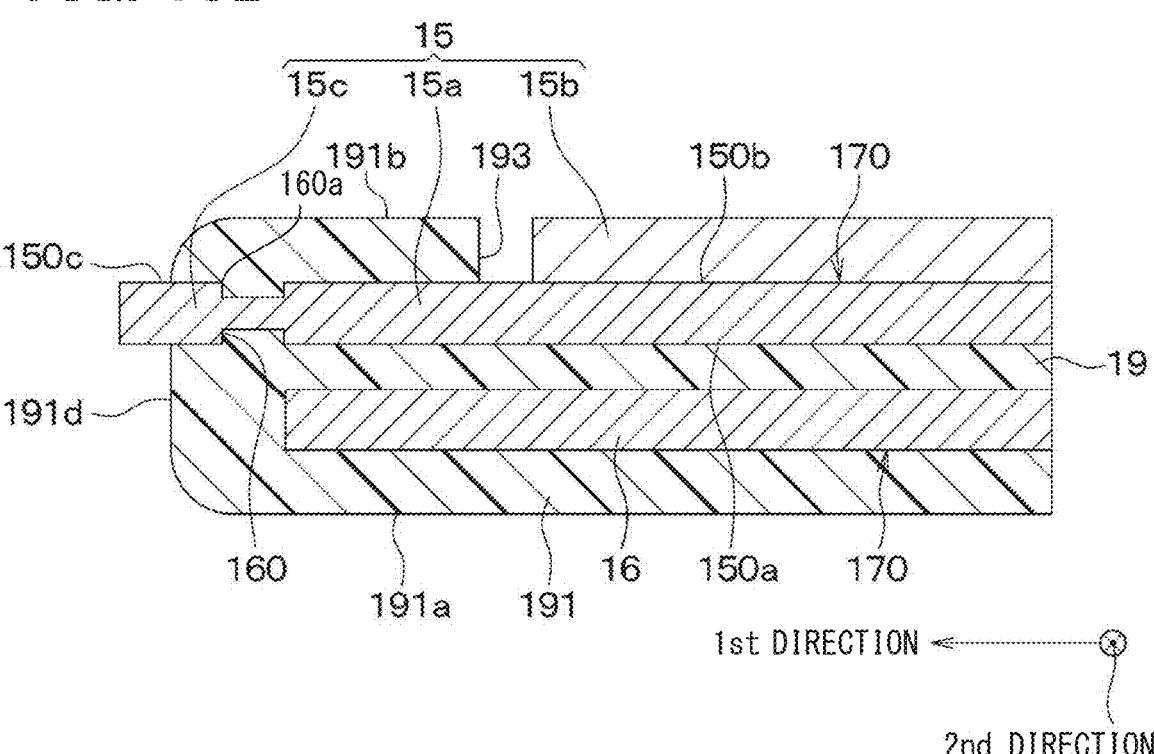
Figure 14:
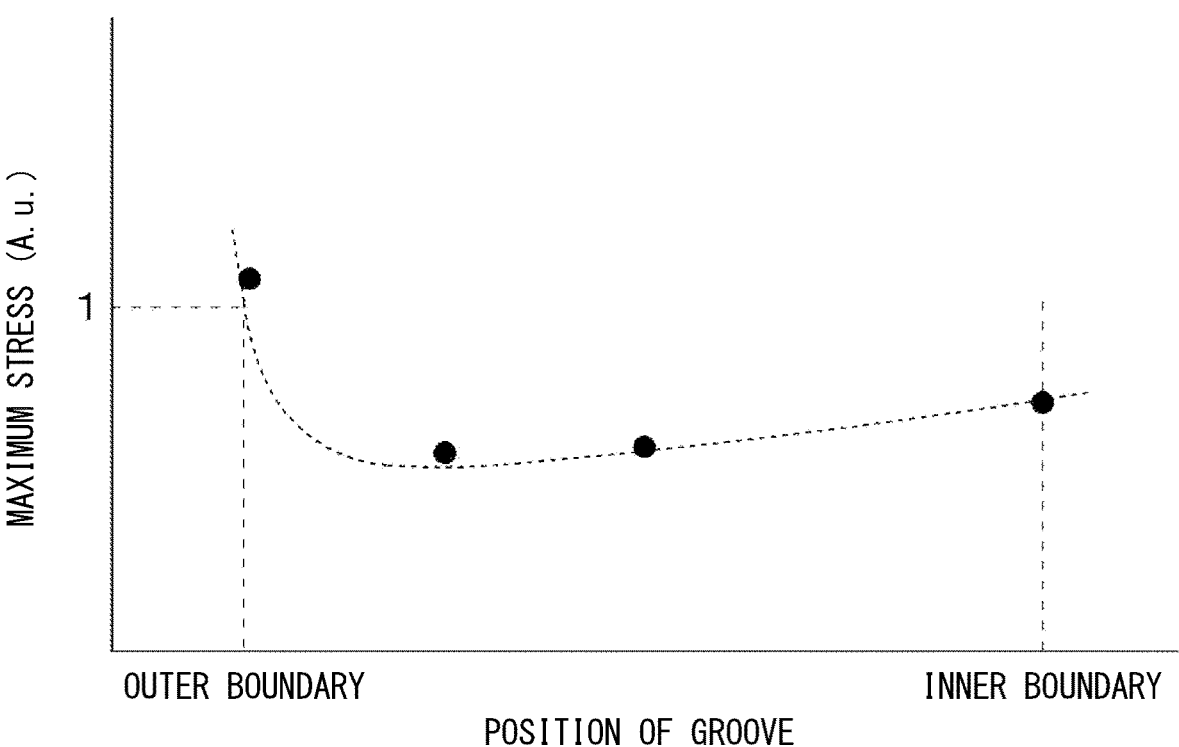
Figure 15:
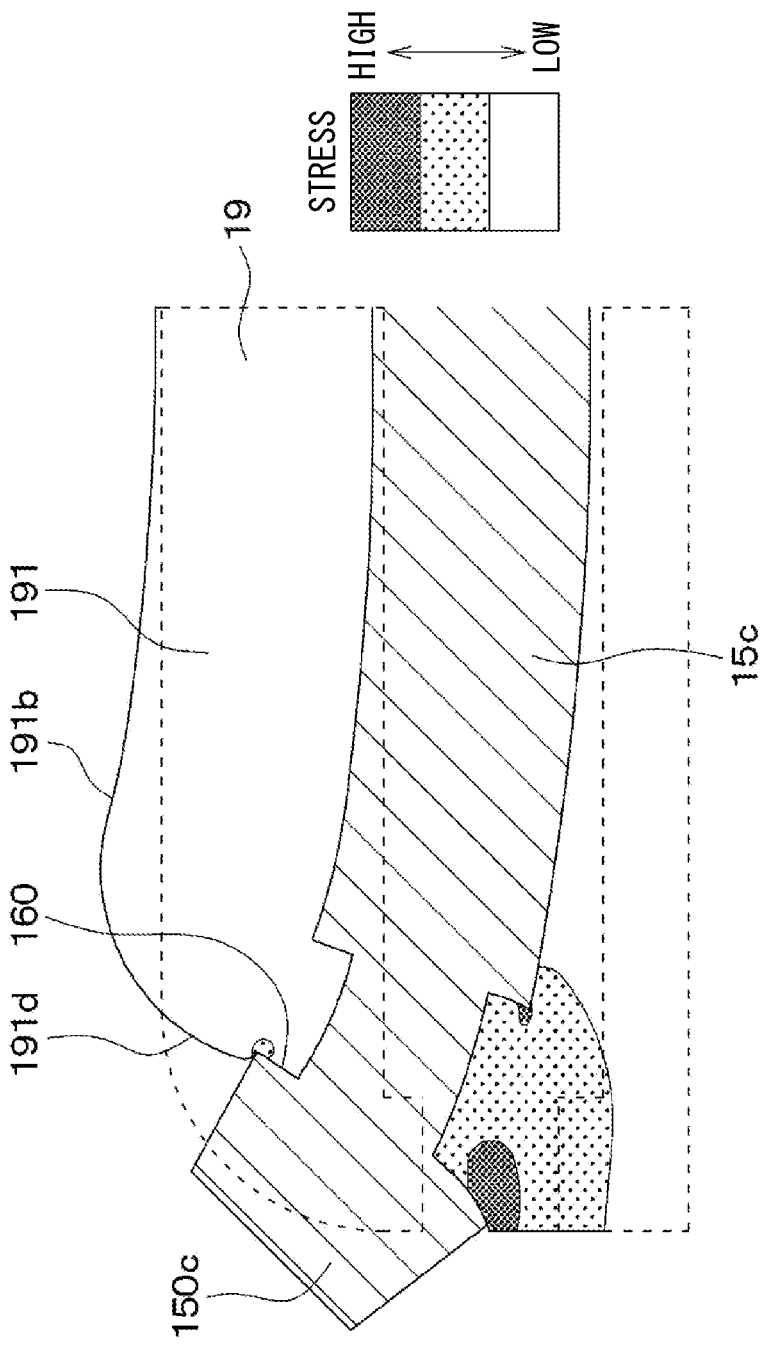
Figure 16:
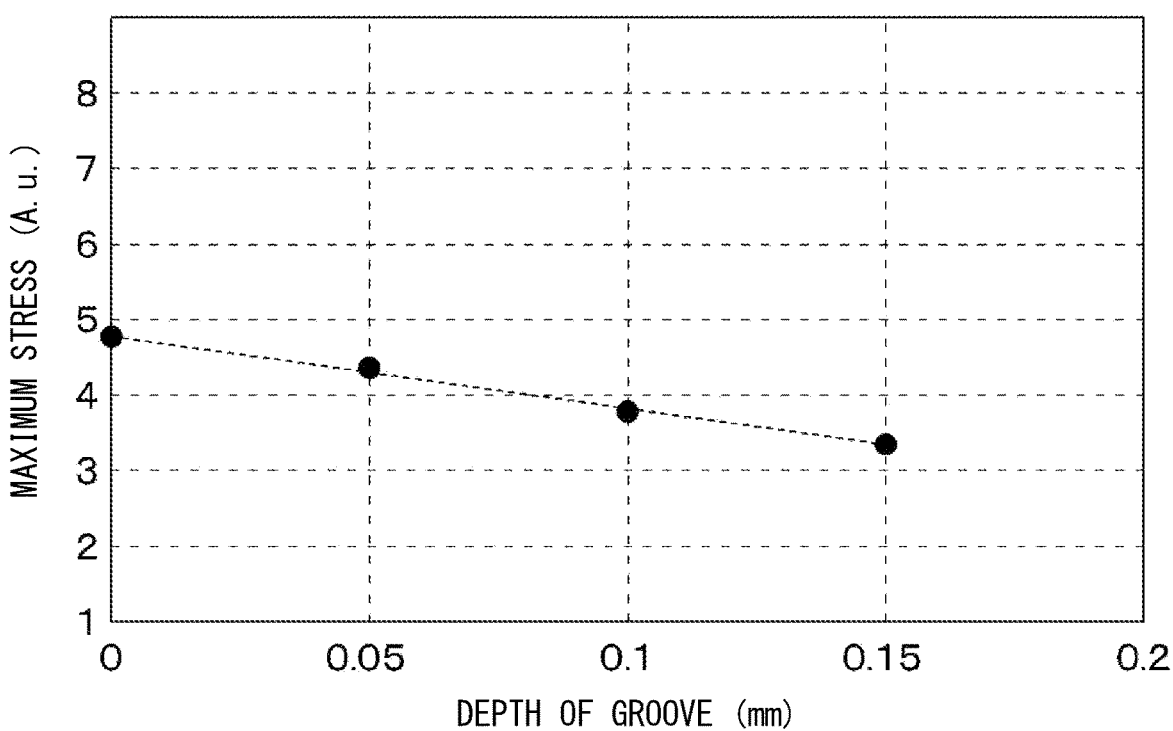
Figure 17:
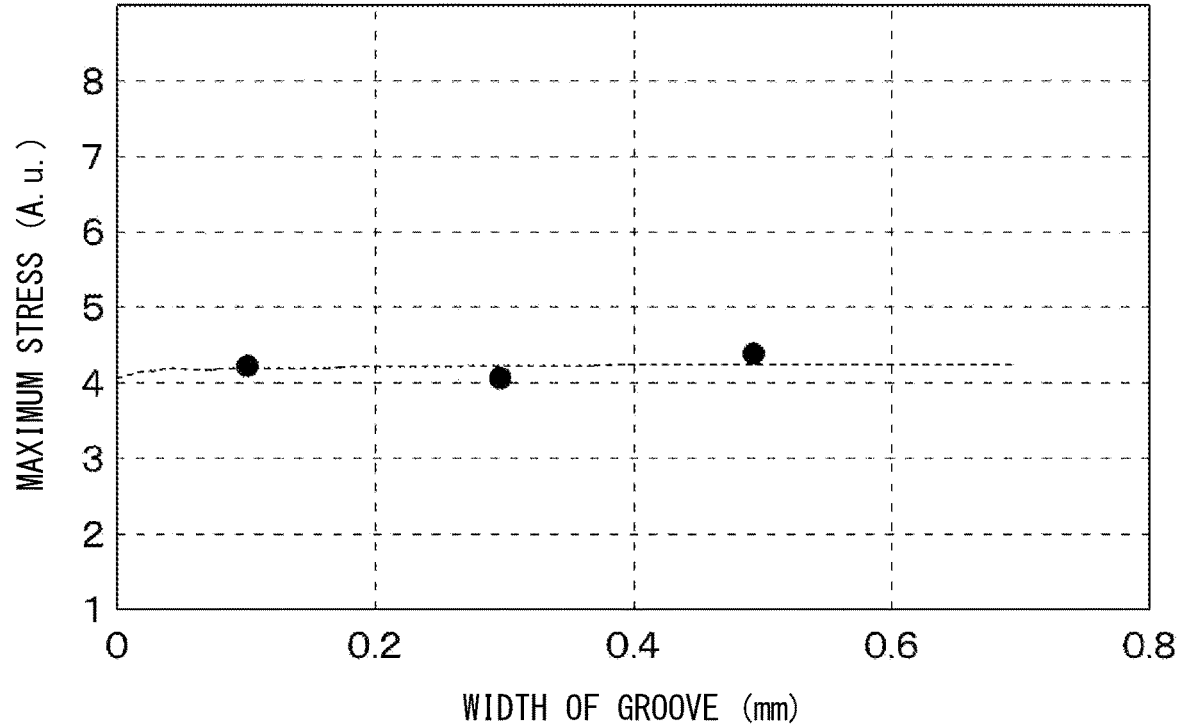
Figure 18:
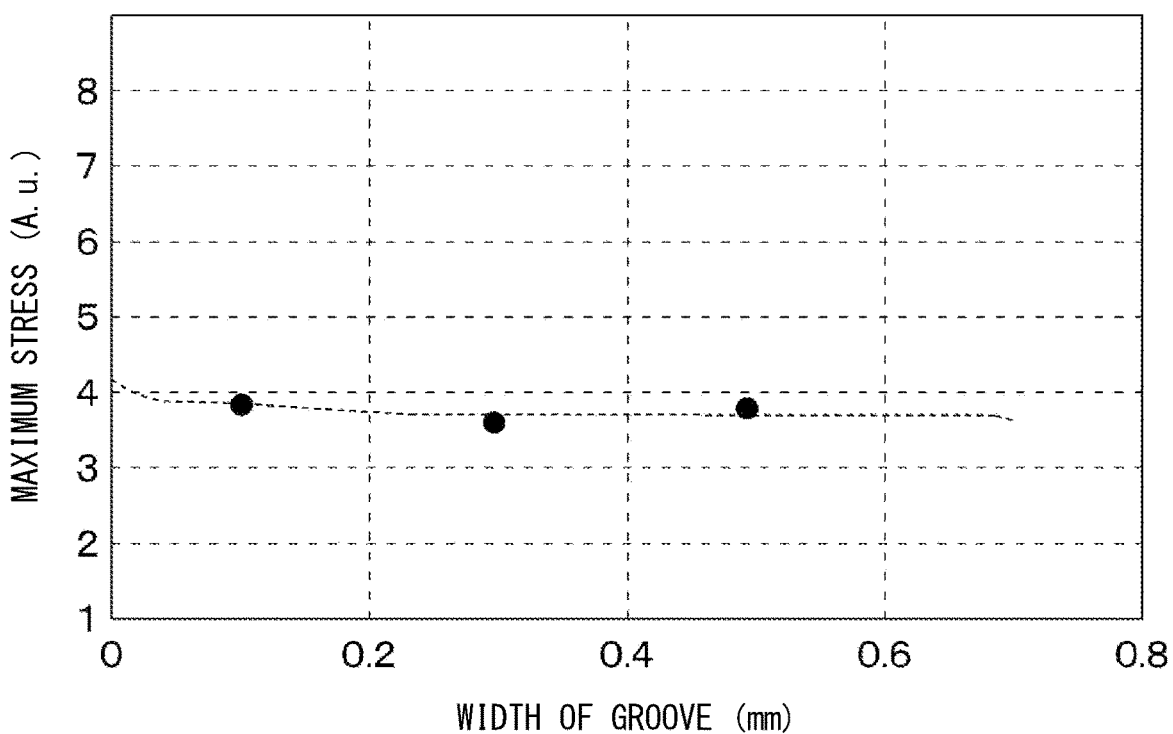
Figure 19:
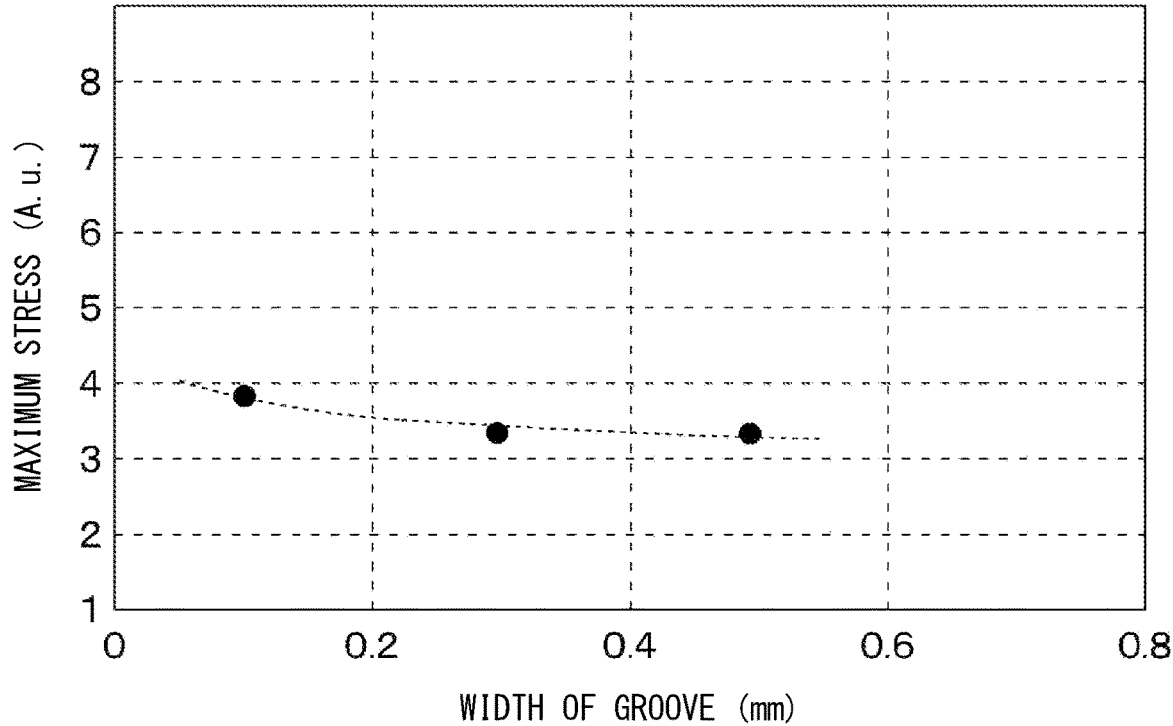
Figure 20:
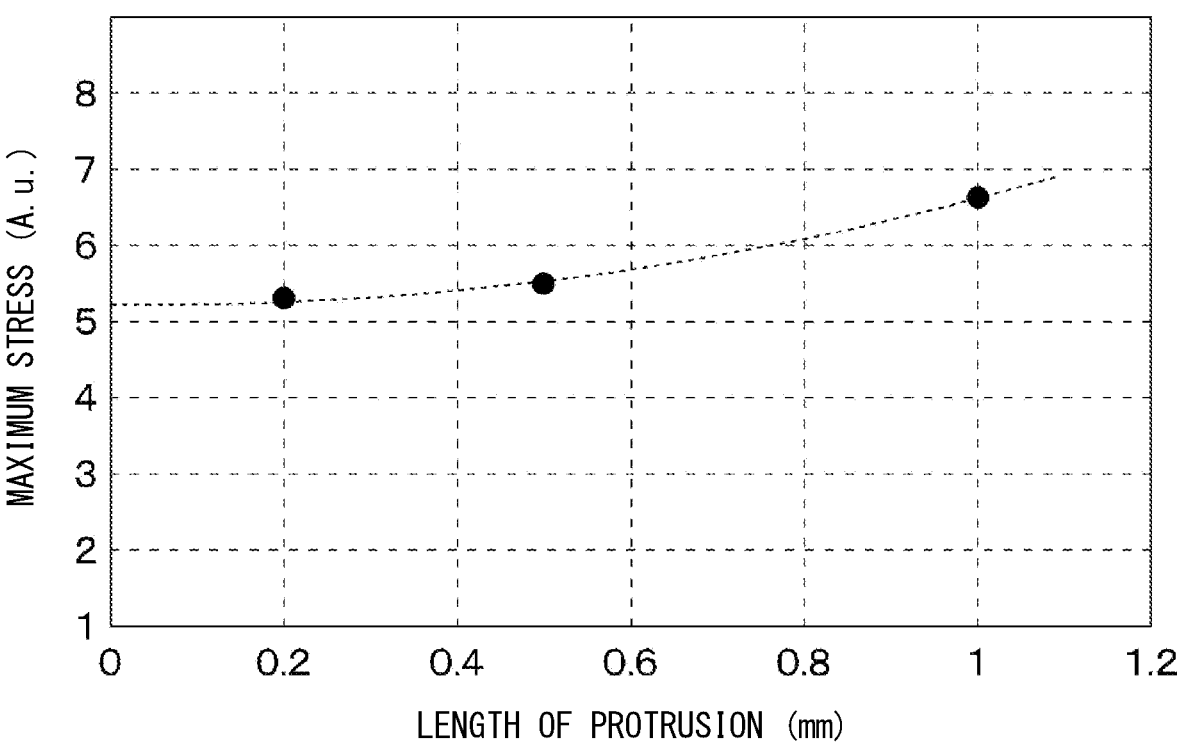
Figure 21:
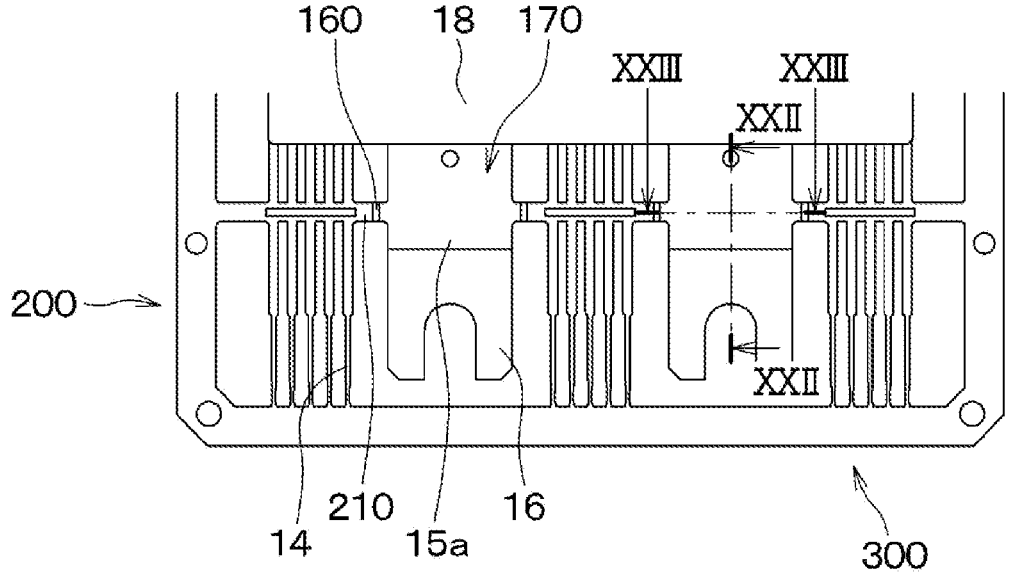
Figure 22:
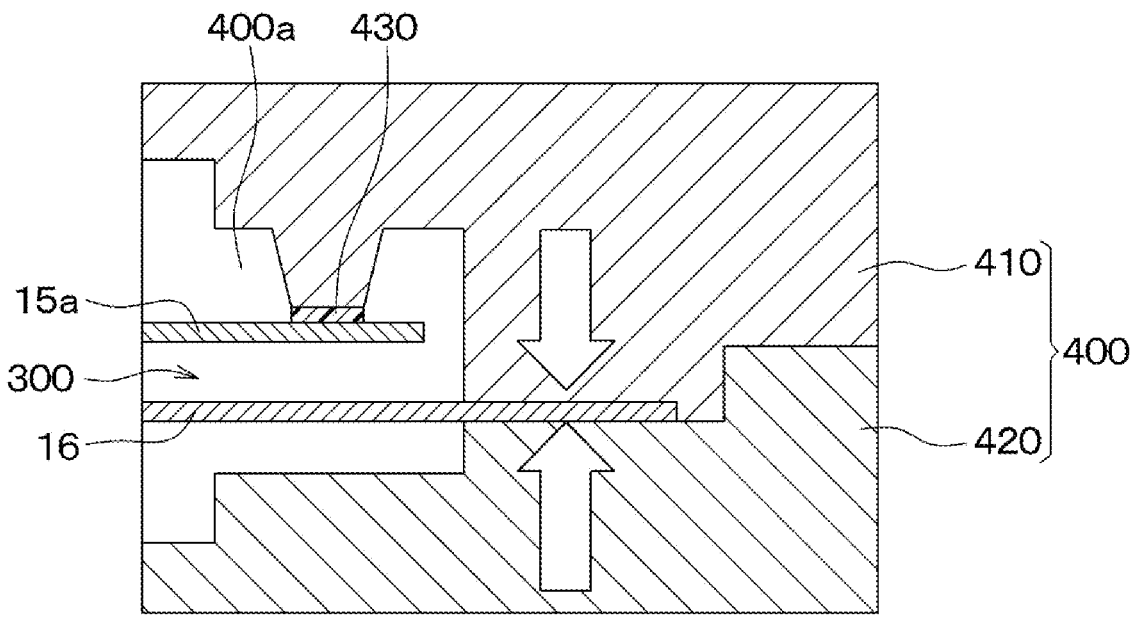
Figure 23:
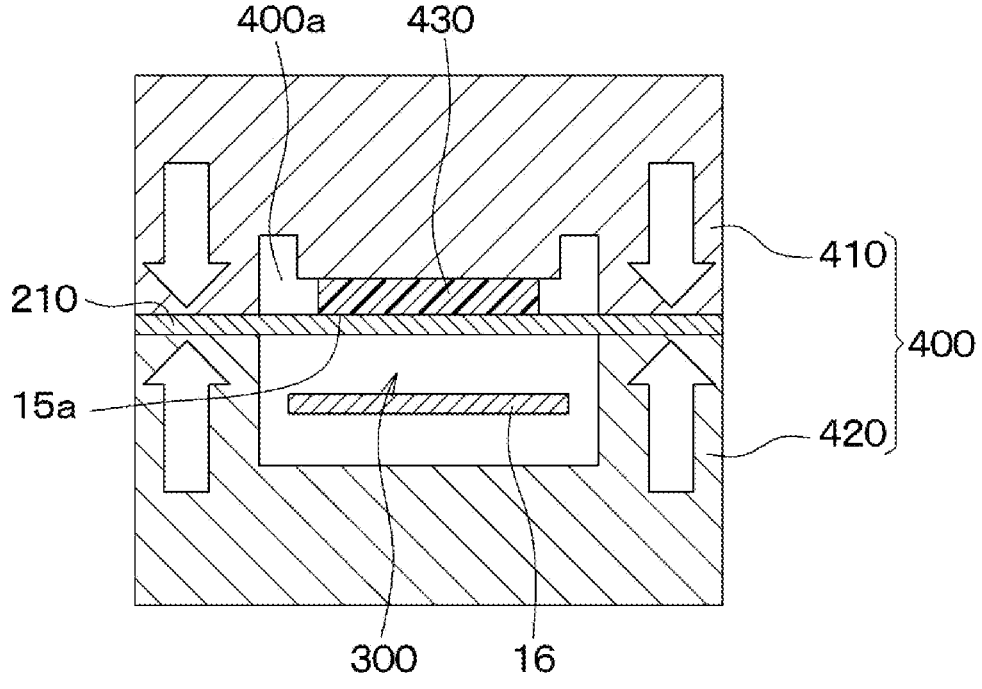
Figure 24:
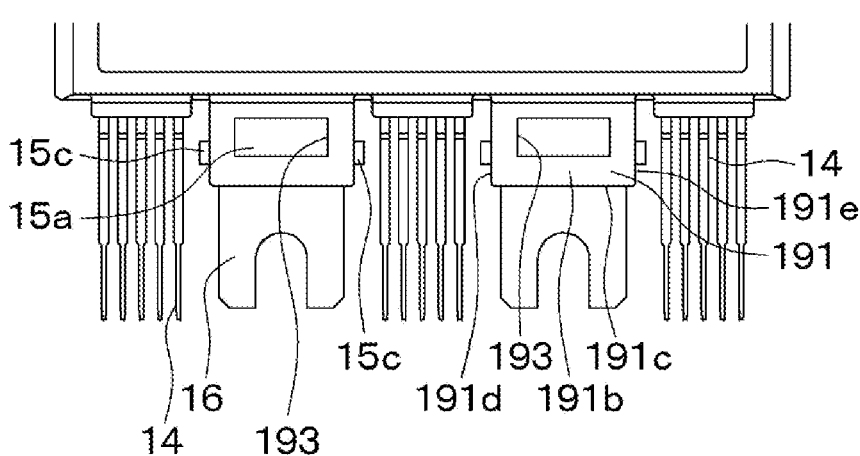

FIG. 1 is a circuit diagram of a three-phase inverter circuit including a semiconductor module according to a first embodiment of the present disclosure;

FIG. 2 is a diagram showing an internal structure of the semiconductor module;

FIG. 3 is a diagram showing a plan view of the semiconductor module viewed from a first surface side of a resin molded part;

FIG. 4 is a diagram showing a plan view of the semiconductor module viewed from a second surface side of the resin molded part, in a state before an external terminal is bonded;

FIG. 5 is a diagram showing a plan view of the semiconductor module viewed from the second surface side of the resin molded part, in a state after the external terminal is bonded;

FIG. 6 is a diagram showing a cross-sectional view taken along a line VI-VI in FIG. 4;

FIG. 7 is a diagram showing a cross-sectional view taken along a line VII-VII in FIG. 5;

FIG. 8 is a diagram showing a side view of the semiconductor module;

FIG. 9 is a diagram showing a cross-sectional view taken along a line IX-IX in FIG. 3;

FIG. 10 is a diagram schematically showing a groove portion;

FIG. 11 is a diagram schematically showing a roughened portion;

FIG. 12 is a diagram for explaining stress generated when the external terminal is ultrasonically bonded to the internal terminal;

FIG. 13A is a diagram showing a cross-sectional view of an internal terminal having a groove portion at a position coinciding with an outer boundary;

FIG. 13B is a diagram showing a cross-sectional view of an internal terminal having a groove portion at a position coinciding with an inner boundary;

FIG. 14 is a diagram showing the relationship between the position of the groove portion and maximum stress;

FIG. 15 is a diagram for explaining stress generated when the external terminal is ultrasonically bonded to the internal terminal in a configuration in which the groove portion is formed at the position coinciding with the outer boundary;

FIG. 16 is a diagram showing the relationship between the depth of the groove portion and the maximum stress;

FIG. 17 is a diagram showing the relationship between the width of the groove portion and the maximum stress;

FIG. 18 is a diagram showing the relationship between the width of the groove portion and the maximum stress;

FIG. 19 is a diagram showing the relationship between the width of the groove portion and the maximum stress;

FIG. 20 is a diagram showing the relationship between the length of a tie bar projecting portion and the maximum stress;

FIG. 21 is a diagram showing a process of manufacturing the semiconductor module;

FIG. 22 is a diagram showing a cross-sectional view of a component member placed in a mold;

FIG. 23 is a diagram showing a cross-sectional view of the component member placed in a mold; and FIG. 24 is a diagram showing a plan view of a part of the component member after the resin molded part is formed in the process of manufacturing the semiconductor module.

DETAILED DESCRIPTION

The inventors of the present disclosure have been considering production of a semiconductor module by forming an opening portion in a resin molded part to expose a connection terminal and by ultrasonically bonding another connection terminal to the opening portion. In other words, the inventors of the present disclosure have been studying a semiconductor module having an internal terminal disposed in a resin molded part and an external terminal that is ultrasonically bonded to the internal terminal.

Further, the inventors of the present disclosure have been studying a following method for manufacturing such a semiconductor module. That is, as the preparation for a terminal constituent member, the terminal constituent member in which an internal terminal, which is to be disposed in a resin molded part, is connected to another member through a tie bar is prepared. Also, as the forming of a resin molded part, the resin molded part is formed so that the internal terminal is exposed from the opening portion. After cutting the tie bar, the external terminal is ultrasonically bonded so as to be connected to the internal terminal exposed from the opening portion. In this way, the semiconductor module can be manufactured.

However, in the method for manufacturing the semiconductor module described above, since the tie bar is cut after the resin molded part is formed, the tie bar remains on the internal terminal, as a tie bar remaining portion, projecting from the resin molded part. According to the studies of the inventors of the present disclosure, it was confirmed that the tie bar remaining portion projecting from the resin molded part is likely to be largely displaced when the external terminal is ultrasonically bonded to the internal terminal. Therefore, if a semiconductor module is manufactured by the method as described above, there is a possibility that the resin molded part located around the tie bar remaining portion projecting from the resin molded part will be damaged.

The present disclosure provides a semiconductor module and a method for manufacturing a semiconductor module, which are capable of suppressing damage to a resin molded part.

According to an aspect of the present disclosure, a semiconductor module includes: a semiconductor chip; a resin molded part that seals the semiconductor chip; and a connection terminal that is electrically connected to the semiconductor chip. The connection terminal includes an internal terminal having a plate shape, an external terminal, and a tie bar remaining portion. The internal terminal is extended in a first direction along a planar direction thereof and sealed in the resin molded part. The internal terminal is exposed from an opening portion formed in the resin molded part. The external terminal is connected to the internal terminal at the opening portion and projected outside the resin molded part. The tie bar remaining portion extends from the internal terminal in a second direction that intersects the first direction and along the planar direction of the internal terminal, and projects outside the resin molded part to provide a tie bar projecting portion. The connection terminal has a groove portion at a position between a portion of the internal terminal exposed from the opening portion and the tie bar projecting portion. The resin molded part is received in the groove portion. The groove portion has an opening edge portion adjacent to the tie bar projecting portion and is covered with the resin molded part together with the opening edge portion.

In such a configuration, the connection terminal is formed with the groove portion at a position between the portion of the internal terminal exposed from the opening portion and the tie bar projecting portion. Therefore, when the external terminal is ultrasonically bonded to the internal terminal at the opening portion, stress can be dispersed, and the maximum stress at the boundary between the tie bar projecting portion and the resin molded part can be reduced. Accordingly, damage to the resin molded part can be suppressed.

According to an aspect of the present disclosure, a method for manufacturing the semiconductor module includes: preparing a terminal constituent member having the internal terminal and a tie bar integrated with the internal terminal; forming the groove portion in a portion of at least one of the internal terminal and the tie bar, which is to be sealed with the resin molded part; forming a component member from the terminal constituent member by electrically connecting the internal terminal to the semiconductor chip; preparing a mold having a first mold part and a second mold part that are engaged so as to define a cavity therebetween; placing the component member in the cavity of the mold; forming the resin molded part by injecting a molten resin into the mold and solidifying the molten resin; cutting the tie bar so that the tie bar remaining portion that extends from the internal terminal and includes the tie bar projecting portion projecting from the molded resin is formed; and ultrasonically bonding the external terminal to the internal terminal.

In such a method, the groove portion is formed in the connection terminal between the portion of the internal terminal exposed from the opening portion and the tie bar projecting portion. Therefore, when the external terminal is ultrasonically bonded to the internal terminal at the opening portion, the stress can be dispersed, and the maximum stress at the boundary between the projecting portion and the resin molded part can be reduced. Accordingly, it is possible to manufacture a semiconductor module in which damage to the resin molded part is suppressed.

Hereinafter, embodiments of the present disclosure will be described with reference to the drawings. In the following descriptions of the embodiments, the same or equivalent parts are denoted by the same reference numerals.

First Embodiment

The following describes a first embodiment with reference to the drawings. In the present embodiment, a semiconductor module that constitutes a three-phase inverter circuit for driving a three-phase alternate current (AC) motor will be described.

First, the three-phase inverter circuit will be described with reference to FIG. 1. A three-phase inverter circuit 1 is for driving a three-phase AC motor as a load 3 based on a direct current (DC) power supply 2. A smoothing capacitor 4 is connected in parallel with the three-phase inverter circuit 1 of the present embodiment, so that a constant power supply voltage can be produced by reducing ripple during switching and suppressing the influence of noise.

The three-phase inverter circuit 1 has a configuration in which series-connected upper and lower arms 51 to 56 are connected in parallel for three phases. In the three-phase inverter circuit 1, intermediate potentials between the upper arms 51, 53, 55 and the lower arms 52, 54, 56 are orderly and alternately applied to the U-phase, V-phase, and W-phase of the three-phase AC motor as the load 3.

Specifically, the upper and lower arms 51 to 56 respectively include semiconductor switching elements $51a$ to $56a$ such as insulated gate bipolar transistors (IGBTs) or metal oxide field effect transistors (MOSFETs), and rectifying elements $51b$ to $56b$ such as free-wheeling diodes (FWDs) for reverse currents. In the three-phase inverter circuit 1, the semiconductor switching elements $51a$ to $56a$ of the upper and lower arms 51 to 56 of each phase are controlled to turn on and off, thereby supplying three-phase alternating currents with different cycles to the load 3.

In the present embodiment, the semiconductor chips on which the semiconductor switching elements 51*a* to 56*a* and the rectifying elements 51*b* to 56*b* for constituting the three-phase inverter circuit 1 are formed are integrated into a semiconductor module. In other words, the three-phase inverter circuit 1 is provided by the semiconductor module with a 6-in-1 structure in which six arms are integrated.

The detailed structure of a semiconductor module 6 of the present embodiment will be described hereinafter with reference to FIGS. 2 to 8. The semiconductor module 6 of the present embodiment includes semiconductor chips 10, first and second lead frames 11 and 12, output terminals 13, control terminals 14, first and second connection terminals 15 and 16, and first and second heat radiation plates 17 and 18. The semiconductor module 6 also includes a resin molded part 19 that integrally encapsulates these constituent elements.

The resin molded part 19 has a substantially rectangular parallelepiped shape with a substantially rectangular planar shape. The resin molded part 19 has a first surface 19*a* and a second surface 19*b* opposite to the first surface 19*a*. The resin molded part 19 also has first through fourth side surfaces 19*c* through 19*f* connecting the first surface 19*a* and the second surface 19*b*. For example, in the resin molded part 19 shown in FIG. 2, side surfaces extending in the left and right direction of FIG. 2 and facing in the up and down direction in FIG. 2 are referred to as the first side surface 19*c* and the third side surface 19*e*. Also, side surfaces extending in the up and down direction in FIG. 2 and facing in the left and right direction in FIG. 2 are referred to as the second side surface 19*d* and the fourth side surface 19*f*. In the present embodiment, the third side surface 19*e* is formed with protrusions 191 that protrude in a direction normal to the third side surface 19*e*. In addition, although the protrusions 191 will be specifically described later, the protrusions 191 are formed at positions where the first and second connection terminals 15 and 16 are arranged. Further, in the present embodiment, a portion of the resin molded part 19 encapsulating the first and second lead frames 11 and 12 and the like is referred to as a body portion 192. The protrusions 191 have a thickness smaller than the thickness of the body portion 192.

Six semiconductor chips 10 are provided correspondingly to the upper and lower arms 51 to 56. The semiconductor chips 10 constituting the upper and lower arms 51 to 56 are hereinafter referred to as semiconductor chips 101 to 106, respectively.

As shown in FIG. 2, the six semiconductor chips 10 are arranged in three rows. Specifically, the semiconductor chips 101, 103 and 105 constituting the upper arms 51, 53 and 55 are aligned in the order of the semiconductor chips 101, 103 and 105 along one direction parallel to the first surface 19*a* of the resin molded part 19. The direction along which the semiconductor chips 101, 103 and 105 are aligned will be referred to as an alignment direction. The semiconductor chips 102, 104 and 106 constituting the lower arms 52, 54 and 56 are aligned in the order of the semiconductor chips 102, 104 and 106 along the alignment of the semiconductor chips 101, 103 and 105.

The first and second lead frames 11 and 12 are each made of a conductive material such as copper or iron. The first and second lead frames 11 and 12 each have a substantially rectangular mounting portion. In a plan view, that is, in a view in a thickness direction of the semiconductor module 6, the first lead frame 11 is arranged adjacent to the first side surface 19*c*, and the second lead frame 12 is arranged adjacent to the third side surface 19*e*.

The semiconductor chips 101, 103 and 105 of the upper arms 51, 53 and 55 are mounted on a front surface side of the first lead frame 11, and the semiconductor chips 102, 104 and 106 of the lower arms 52, 54 and 56 are mounted on a back surface side of the second lead frame 12. The front surface of the first lead frame 11 is a surface adjacent to the first surface 19*a* of the resin molded part 19. The back surface of the second lead frame 12 is a surface adjacent to the second surface 19*b* of the resin molded part 19.

The semiconductor chips 101, 103 and 105 are connected to the output terminals 13 via the first lead frame 11. The semiconductor chips 102, 104 and 106 are connected to the output terminals 13 via the second lead frame 12, wiring layers (not shown), and the first lead frame 11.

The semiconductor module 6 has three output terminals 13. The three output terminals 13 are connected to the U-phase, V-phase, and W-phase of the load 3, respectively. In the present embodiment, the output terminal 13 is made of a plate-shaped conductive member and projects from the first side surface 19*c* of the resin molded part 19.

Each of the semiconductor chips 101 to 106 is connected to the control terminals 14. The control terminals 14 are connected to a gate electrode or the like formed on a corresponding one of the semiconductor chips 101 to 106. The control terminal 14 is made of a rod-shaped conductive member, and has one end connected to the corresponding one of the semiconductor chips 101 to 106 and the other end projecting from the first side surface 19*c* or the third side surface 19*e* of the resin molded part 19. A portion of the control terminal 14 exposed from the resin molded part 19 is bent toward the first surface 19*a* of the resin molded part 19 so as to project from the first surface 19*a* in a thickness direction of the resin molded part 19. The thickness direction of the resin molded part 19 corresponds to a left and right direction in FIG. 8.

Specifically, the control terminals 14 are provided for each of the semiconductor chips 101 to 106. The control terminals 14 connected to the semiconductor chips 101, 103 and 105 of the upper arms 51, 53 and 55 project from the first side surface 19*c* of the resin molded part 19 on the same side as the output terminals 13. The control terminals 14 connected to the semiconductor chips 102, 104 and 106 of the lower arms 52, 54 and 56 project from the third side surface 19*e* of the resin molded part 19 on the side opposite to the output terminals 13.

The first and second connection terminals 15 and 16 are provided to connect the semiconductor chips 10 to the smoothing capacitor 4. The first and second connection terminals 15 and 16 each have a plate shape. As shown in FIGS. 6 to 8, the first and second connection terminals 15 and 16 are arranged to overlap each other in the thickness direction of the resin molded part 19 and projected from the third side surface 19*e* of the resin molded part 19 in the overlapped state. That is, the first and second connection terminals 15 and 16 project from the third side surface 19*e*, that is, on the same side as the control terminals 14 connected to the semiconductor chips 102, 104 and 106 of the lower arms 52, 54 and 56, project. The protrusion 191 of the resin molded part 19 has a first protrusion surface 191*a* on a side adjacent to the first surface 19*a* of the body portion 192, and a second protrusion surface 191*b* on a side adjacent to the second surface 19*b* of the body portion 192. The protrusion 191 further has a tip surface 191*c* at an end opposite to the body portion 192. The protrusion 191 further has a first protrusion side surface 191*d* and a second protrusion side surface 191e that connect to the protrusion tip surface 191c. The protrusion tip surface 191c can also be regarded as an end surface positioned on the tip side of the protrusion 191 in a protruding direction of the protrusion 191. In the present embodiment, within the protrusion 191, the first connection terminal 15 and the second connection terminal 16 are disposed in the overlapped state so that the first connection terminal 15 is located adjacent to the first protrusion surface 191a and the second connection terminal 16 is located adjacent to the second protrusion surface 191b.

The first and second connection terminals 15 and 16 are layered with a predetermined distance therebetween, and are electrically insulated by interposing a portion of the resin molded part 19 therebetween. Also, the first and second connection terminals 15 and 16 are each arranged at a predetermined distance from the control terminals 14 connected to the semiconductor chips 102, 104 and 106 of the lower arms 52, 54 and 56, respectively. For example, the distance between the control terminals 14 and the first and second connection terminals 15 and 16 is designed to be longer than a distance that ensures insulation between the control terminals 14 and the first and second connection terminals 15 and 16 when a predetermined impulse voltage is applied.

The first connection terminal 15 is a terminal that connects the semiconductor chips 101, 103 and 105 to the positive terminal of the DC power supply 2 via the smoothing capacitor 4. The second connection terminal 16 is a terminal that connects the semiconductor chips 102, 104, 106 to the negative electrode of the DC power supply 2 via the smoothing capacitor 4.

The first connection terminal 15 of the present embodiment has an internal terminal 15a sealed in the resin molded part 19 and an external terminal 15b disposed outside the resin molded part 19. The internal terminal 15a is made of a plate-shaped conductive member and connected to the semiconductor chips 101, 103, 105 of the upper arms 51, 53, 55 via the first lead frame 11.

The semiconductor module 6 of the present embodiment has two first connection terminals 15. The two first connection terminals 15 are arranged so as to interpose the semiconductor chips 103 and 104, which are arranged in the central row of the three rows of the six semiconductor chips 10. Specifically, the internal terminal 15a of one of the two first connection terminals 15 is arranged to pass between the semiconductor chips 101 and 103 and between the semiconductor chips 102 and 104. The internal terminal 15a of the other of the two first connection terminals 15 is arranged to pass between the semiconductor chips 103 and 105 and between the semiconductor chips 104 and 106.

The internal terminal 15a is connected to the semiconductor chips 101, 103 and 105 via the first lead frame 11 at one end in the longitudinal direction, and is covered with the protrusion 191 at the other end. The internal terminal 15a is exposed through an opening portion 193 that is formed on the second protrusion surface 191b of the protrusion 191.

The external terminal 15b is made of a plate-shaped conductive member, and is bent in a substantially crank shape when viewed from the side. The external terminal 15b has two ends on opposite sides of the bent. A first end of the external terminal 15b is connected to the internal terminal 15a by ultrasonic bonding. A second end of the external terminal 15b projects along the second protrusion surface 191b of the protrusion 191 while being separated from the second protrusion surface 191b. Although not particularly limited, the distance between the portion of the external terminal 15b including the second end and the protrusion 191 is, for example, 0.1 mm or more and 2 mm or less in order to restrict foreign matter from being caught therebetween. This projected portion of the external terminal 15b is connected to the smoothing capacitor 4.

In addition, the first connection terminal 15 of the present embodiment has tie bar remaining portions 15c that project from the first and second protrusion side surfaces 191d and 191e of the protrusion 191. The tie bar remaining portion 15c is a portion left after cutting a tie bar 210 connecting the internal terminal 15a and the control terminal 14, as will be described later. In the present embodiment, the first connection terminal 15 has two tie bar remaining portions 15c on opposite sides of the internal terminal 15a. The tie bar remaining portions 15c are connected to the internal terminal 15a, respectively. The tie bar remaining portions 15c each extend in a direction intersecting the extending direction of the internal terminal 15a and along the planar direction of the internal terminal 15a, and project from the first and second protrusion side surfaces 191d and 191e. The internal terminals 15a and the control terminals 14 are connected to each other through the tie bars 210 in a state before the semiconductor module 6 is produced, as will be described later. Therefore, the control terminals 14, the internal terminals 15a, and the tie bar remaining portions 15c are positioned on the same plane.

The external terminal 15b is bonded to the internal terminal 15a by ultrasonic bonding as described above. Here, as shown in FIG. 9, the direction along the extension direction of the tie bar remaining portion 15c is defined as a first direction, and the direction intersecting the first direction and along the planar direction of the inner terminal 15a is defined as a second direction. The first direction corresponds to a left and right direction in FIG. 9. The second direction corresponds to a direction normal to the plane of FIG. 9. The planar direction of the internal terminal 15a corresponds to a direction along the main surface of the internal terminal 15a, and is perpendicular to the thickness direction of the internal terminal 15a.

The ultrasonic bonding of the present embodiment is performed by ultrasonically vibrating the external terminals 15b along the first direction. In this case, the internal terminal 15a vibrates due to the vibrations during the ultrasonic bonding. Thus, the tie bar remaining portion 15c connected to the internal terminal 15a also vibrates. Here, a portion of the tie bar remaining portion 15c that protrudes from the resin molded part 19 is referred to as a tie bar projecting portion 150c. In this case, since the tie bar projecting portion 150c is not sealed with the resin molded part 19, the influence of vibration onto the tie bar projecting portion 150c increases. Therefore, when the external terminal 15b is bonded to the internal terminal 15a by ultrasonic bonding, the largest stress is generated at the boundary between the first and second protrusion side surfaces 191d and 191e of the protrusion 191 and the tie bar projecting portions 150c.

Therefore, in the present embodiment, as shown in FIG. 9, the first connection terminal 15 is formed with a groove portion 160 at a position between an exposing portion exposing from the opening portion 193 and the tie bar projecting portion 150c exposing from the resin molded part 19 in the first direction. In the present embodiment, the groove portion 160 is formed at a portion of the tie bar remaining portion 15c that is sealed with the resin molded part 19. The first connection terminal 15 has a first main surface 150a on a side facing the second connection terminal 16, and a second main surface 150b opposite to the first main surface 150a. The groove portion 160 is formed on each of the first main surface 150a and the second main surface 150b. Further, the resin molded part 19 is formed so that a portion of the resin molded part 19 is received in the groove portion 160.

The first connection terminal 15 and the second connection terminal 16 are arranged to overlap in the thickness direction that is perpendicular to the first direction and the second direction. The thickness direction will be also referred to as an overlapping direction. In the present embodiment, the internal terminal 15a of the first connection terminal 15 provides a facing part facing the second connection terminal 16 across the resin molded part 19 in the overlapping direction. The tie bar remaining portion 15c is a portion that is connected to the internal terminal 15a, and does not overlap the second connection terminal 16 in the overlapping direction. In addition, in the semiconductor module 6 of the present embodiment, the current flows along the extending direction of the first connection terminal 15 and the extending direction of the second connection terminal 16. For this reason, the tie bar remaining portion 15c is a portion different from a main portion of the first connection terminal 15 through which the current mainly flows. The groove portion 160 is formed in a portion of the first connection terminal 15 different from the main portion of the first connection terminal 15 through which the current mainly flows.

As shown in FIG. 10, the groove portion 160 of the present embodiment is provided by a plurality of recesses 161. Specifically, the groove portion 160 includes the plurality of recesses 161 that extend along the second direction, as a longitudinal direction, and thus are arranged into a stripe shape. In other words, the groove portion 160 is provided by the plurality of recesses 161 extending in a direction intersecting the direction of ultrasonic vibration.

Although not shown in detail in FIG. 9 and the like, the internal terminal 15a and the tie bar remaining portion 15c are formed with roughened portions 170 at positions different from the groove portion 160 and sealed with the resin molded part 19. Specifically, as shown in FIG. 11, the roughened portion 170 is formed with a plurality of recesses 171 interspersed. In this case, the groove portion 160 and the roughened portion 170 are formed so that the depth of the groove portion 160 (that is, the recesses 161) is larger than the depth of the roughened portion 170 (that is, the recesses 171). In other words, the groove portion 160 and the roughened portion 170 are formed such that the groove portion 160 has a larger surface roughness than that of the roughened portion 170. Although not particularly limited, the groove portion 160 has a depth of, for example, about 8 μm, and has a surface area ratio of about 110% relative to the surface area when the groove portion 160 is not formed. For example, the roughened portion 170 has a depth of about 1 μm, and has a surface area ratio of about 104% relative to the surface area when the roughened portion 170 is not formed.

Note that the groove portion 160 and the roughened portion 170 of the present embodiment are formed by applying a laser beam from a common laser device. However, the groove portion 160 and the roughened portion 170 are formed such that the energy for forming the groove portion 160 is larger than the energy for forming the roughened portion 170. The roughened portion 170 is also formed on the second connection terminal 16, which will be described later.

In the present embodiment, since the first connection terminal 15 is formed with the groove portion 160, it is possible to disperse stress concentration points when the external terminal 15b is ultrasonically bonded to the internal terminal 15a. For example, as shown in FIG. 12, it is assumed that the tie bar projecting portion 150c of the tie bar remaining portion 15c is displaced toward the second protrusion surface 191b of the protrusion 191 by ultrasonically bonding the external terminal 15b to the internal terminal 15a. In this case, it is confirmed that the stress concentration points occurring in the resin molded part 19 are at the boundary portion with the tie bar projecting portion 150c in the first protrusion side surface 191d, and the portion received in the groove portion 160. If the groove portion 160 is not formed, there is no place to disperse the stress, so the stress occurring in the resin molded part 19 concentrates on the boundary portion with the tie bar projecting portion 150c in the first protrusion side surface 191d. Therefore, in the present embodiment, since the groove portion 160 is formed in the portion sealed with the resin molded part 19, stress can be dispersed, and damage to the resin molded part 19 can be suppressed.

FIG. 13A shows a case in which the groove portion 160 is formed so that the end of the groove portion 160 adjacent to the tie bar projecting portion 150c coincides with the first protrusion side surface 191d, that is, a configuration in which the groove portion 160 is formed at the outer boundary. In the configuration in which the groove portion 160 is formed at the outer boundary, it can be regarded as a configuration in which an opening edge portion 160a of the groove portion 160 on the tie bar projecting portion 150c side is exposed from the resin molded part 19. FIG. 13B shows a case in which the groove portion 160 is formed so that the end of the groove portion 160 adjacent to the internal terminal 15a overlaps the second connection terminal 16 in the overlapping direction of the internal terminal 15a and the second connection terminal 16, that is, a configuration in which the groove portion 160 is formed at an inner boundary portion. Note that, although only a part of the resin molded part 19 adjacent to the first protrusion side surface 191d is shown in FIGS. 13A and 13B, a part adjacent to the second protrusion side surface 191d has the similar configuration.

FIG. 14 shows the maximum stress caused in the configuration in which the groove portion 160 is formed at the outer boundary and the configuration in which the groove portion 160 is formed at the inner boundary, relative to the configuration without having the groove portion 160. That is, the maximum stress caused in the configuration without having the groove portion 160 is defined as 1, as a reference stress. As shown in FIG. 14, it is confirmed that, in the configuration in which the groove portion 160 is formed at the outer boundary, the maximum stress is higher than the reference stress. When the position of the groove portion 160 is slightly shifted toward the inner boundary, the maximum stress is sharply decreased. When the position of the groove portion 160 is further shifted toward the inner boundary, the maximum stress gradually increases. FIG. 14 shows the simulation results in which the groove portion 160 has the width of 0.3 mm and the depth of 0.1 mm. The width of the groove portion 160 is a dimension along the first direction.

The reason the maximum stress is caused as described above will be described hereinafter. First, as shown in FIG. 15, in the case where the groove portion 160 is formed at the outer boundary, it is confirmed that the stress concentration points are less dispersed. Also, a stress due to the deformation of the portion of the resin molded part 19 received in the groove portion 160 is also applied to the boundary portion between the tie bar projecting portion 150c and the first protrusion side surface 191d. Thus, in the case in which the groove portion 160 is formed at the outer boundary, there is a possibility that the maximum stress is greater than the reference stress. Note that FIG. 15 shows a simulation result in the case where the tie bar projecting portion 150c is displaced toward the second protrusion surface 191b of the protrusion 191 by ultrasonically bonding the external terminal 15b to the internal terminal 15a, similar to FIG. 12.

Making the groove portion 160 closer to the inner boundary means to arrange the groove portion 160 closer to the opening portion 193, and to bring the groove portion 160 closer to the bonding portion with the outer terminal 15b. Therefore, if the groove portion 160 is made too close to the inner boundary portion, it becomes difficult to reduce the influence of vibration when connecting the external terminal 15b to the internal terminal 15a, and thus the maximum stress gradually increases. Therefore, it is preferable that the groove portion 160 is formed at the position that is sealed with the resin molded part 19, and is more to inside than the outer boundary. It is further preferable that the groove portion 160 is formed at the position that is on the opposite side to the internal terminal 15a in the tie bar remaining portion 15c. Forming the groove portion 160 at the position sealed with the resin molded part 19 and is more to inside than the outer boundary means a situation that the opening edge portion 160a of the groove portion 160 at the tie bar projecting portion 150c side is also sealed with the resin molded part 19.

In addition, as shown in FIG. 16, it is confirmed that the maximum stress can be reduced as the depth of the groove portion 160 is increased. FIG. 16 is a diagram showing a simulation result of the configuration in which the width of the groove portion 160 is set to 0.5 mm and the thickness of the tie bar remaining portion 15c in a portion different from the portion where the groove portion 160 is formed is set to 0.5 mm. FIG. 16 also shows the results when the depth of the groove portion 160 is increased to 0.15 mm. In the present embodiment, the groove portions 160 are formed on both of the first main surface 150a side and the second main surface 150b side of the tie bar remaining portion 15c. In order to prevent the tie bar remaining portion 15c from breaking, the thickness of the portion left between the groove portions 160 is preferably ½ or more of the thickness of the tie bar remaining portion 15c. Therefore, when the groove portions 160 are formed on the first main surface 150a side and the second main surface 150b side of the tie bar remaining portion 15c as in the present embodiment, the depth of each groove portion 160 is preferably less than 0.125 mm.

The groove portion 160 also exhibits a function of suppressing vibration when the external terminal 15b is ultrasonically bonded to the internal terminal 15a. In this case, the inventors of the present disclosure have confirmed that the depth of the groove portion 160 is preferably ¹⁄₁₀ or more of the thickness of the tie bar remaining portion 15c. Therefore, the groove portion 160 has the depth of ¹⁄₁₀ or more of the thickness of the tie bar remaining portion 15c.

Furthermore, the inventors of the present disclosure have made extensive studies on the width of the groove portion 160, and obtained the results shown in FIGS. 17 to 19. FIG. 17 shows the simulation results when the depth of the groove portion 160 is set to 0.05 mm and the width of the groove portion 160 is changed. FIG. 18 shows the simulation results when the depth of the groove portion 160 is set to 0.10 mm and the width of the groove portion 160 is changed. FIG. 19 shows the simulation results when the depth of the groove portion 160 is set to 0.15 mm and the width of the groove portion 160 is changed. As shown in FIGS. 17 to 19, it is confirmed that even if the width of the groove portion 160 is changed, the maximum stress does not largely change.

Therefore, the depth of the groove portion 160 is preferably adjusted according to conditions when the external terminals 15b are ultrasonically bonded. However, the groove portion 160 needs to have the width so that the resin molded part 19 sufficiently enters and is received in the groove portion 160. Thus, the width of the groove portion 160 is preferably 50 μm or more. In addition, in the case where the groove portion 160 is formed by applying the laser beam, the width of the groove portion 160 is preferably 50 μm or more in order to facilitate manufacturing. Therefore, the groove portion 160 of the present embodiment has the width of 50 μm or more.

Furthermore, the tie bar remaining portion 15c has the tie bar projecting portions 150c projecting from the first and second protrusion side surfaces 191d and 191e of the protrusion 191 as described above. In this case, as shown in FIG. 20, the maximum stress increases as the length of the tie bar projecting portion 150c in the projecting direction (that is, the dimension in the first direction) increases. Therefore, it is preferable that the length of the tie bar projecting portion 150c of the tie bar remaining portion 15c is short, for example, 1 mm or less.

The second connection terminal 16 is made of a plate-shaped conductive member. The second connection terminal 16 is connected to the semiconductor chips 10 of the lower arms 52, 54, and 56 via the second lead frame 12. The second connection terminal 16 is connected to the semiconductor chips 102, 104, and 106 via the second lead frame 12 at one end in the longitudinal direction, and the other end of the second connection terminal 16 extends from the third side surface 19e of the resin molded part 19 in the same direction as the projecting direction of the external terminal 15b. Specifically, the second connection terminal 16 is arranged so as to project from the tip surface 191c of the protrusion 191 provided on the third side surface 19e. In the present embodiment, the protrusion tip surface 191c corresponds to a predetermined surface of the resin molded part 19.

The semiconductor module 6 has two second connection terminals 16. Moreover, as described above, the semiconductor module 6 has two first connection terminals 15. The first connection terminal 15 and the second connection terminal 16 are arranged in layers. In other words, the first connection terminal 15 and the second connection terminal 16 are arranged to overlap with each other in the thickness direction.

Further, in the present embodiment, the creepage distance along the resin molded part 19 between the portion of the tie bar remaining portion 15c projecting from the protrusion 191 and the second connection terminal 16 in the plan view is adjusted so as to maintain the dielectric strength. Although not particularly limited, the creepage distance is set to 4 mm or more in the present embodiment. In other words, the arrangement position of the tie bar remaining portion 15c is adjusted such that the creepage distance along the resin molded part 19 between the tie bar remaining portion 15c and the second connection terminal 16 is a desired distance so as to maintain insulation resistance in the plan view.

The external terminal 15b has the same planar shape as the second connection terminal 16 with respect to the overlapping direction, that is, when viewed in the direction normal to the surface of the external terminal 15b. In the present embodiment, tips of the portions of the external terminal 15b and the second connection terminal 16 projecting from the protrusion 191 each have a shape corresponding to a fastening member such as a bolt so as to be connected to the smoothing capacitor 4. Specifically, the tips of the portions of the external terminal 15b and the second connection terminal 16 projecting from the protrusion 191 is each divided into two sections to be approximately a U-shaped portion. The U-shaped portion of the external terminal 15b and the U-shaped portion of the second connection terminal 16 have the same or substantially the same shape. The projection length of the external terminal 15b and the projection length of the second connection terminal 16 are the same or substantially the same in the projection direction of the external terminal 15b and the second connection terminal 16.

The first and second heat radiation plates 17 and 18 correspond to heat sinks and each have a surface facing the semiconductor chip 10. The semiconductor chips 101 to 106 are connected to the first and second heat radiation plates 17 and 18 via the first and second lead frames 11 and 12, respectively. The first and second heat radiation plates 17 and 18 each have a surface exposed from the resin molded part 19 on the side opposite to the first and second lead frames 11 and 12. As described above, the semiconductor chips 101 to 106 are disposed between the first and second heat radiation plates 17 and 18. The semiconductor module 6 is used to drive the load 3 in a state where the semiconductor module 6 is interposed on both sides in the thickness direction by cooling equipment (not shown) to ensure heat dissipation.

The semiconductor module 6 of the present embodiment has the configurations as described above. Although not described in detail, the semiconductor module 6 is used in the state in which the first and second connection terminals 15 and 16 are connected to the smoothing capacitor 4, and the output terminals 13 are connected to the load 3.

Next, a method for manufacturing the semiconductor module 6 will be described with reference to FIGS. 21 to 24. FIGS. 21 and 24 are plan views on the first connection terminal 15 side.

First, the semiconductor chips 101 to 106 are mounted on the first and second lead frames 11 and 12. Then, the output terminals 13 and the second connection terminals 16 are electrically connected to the semiconductor chips 101 to 106. Further, as shown in FIG. 21, a terminal constituent member 200 in which the internal terminals 15a of the first connection terminals 15 and the control terminals 14 are integrally connected through the tie bars 210 is prepared. Then, using the same laser device, a laser beam is applied so as to form the groove portions 160 in the portions of the tie bars 210 to be sealed with the resin molded part 19, and to form the roughened portions 170 in the portions of the internal terminal 15a and the control terminals 14 to be sealed with the resin molded part 19. In this case, the groove portions 160 and the roughened portions 170 are formed by changing irradiation conditions, such as energy, so that the groove portions 160 are deeper than the roughened portions 170.

Thereafter, the internal terminals 15a and the control terminals 14 are electrically connected to the respective semiconductor chips 101 to 106. Further, the first and second heat radiation plates 17 and 18 are arranged. In this way, a component member 300 in which the internal terminals 15a and the second connection terminals 16 are connected to the semiconductor chips 101 to 106 is prepared.

Subsequently, as shown in FIGS. 22 and 23, the component member 300 is placed in a cavity 400a of a mold 400. The mold 400 includes a first mold part 410 and a second mold part 420 that are engaged to form the cavity 400a therein. Specifically, as shown in FIG. 22, the component member 300 is placed so that the portions of the second connection terminals 16 exposing from the protrusion 191 of the resin molded part 19 are held between the first mold part 410 and the second mold part 420. Further, as shown in FIG. 23, the component member 300 is placed so that the tie bars 210 of the component member 300 and the portions of the control terminals 14 to be exposed from the resin molded part 19 are held between the first mold part 410 and the second mold part 420. That is, since the internal terminals 15a are connected to the tie bars 210, the component member 300 is placed so that the internal terminals 15a are fixed at predetermined positions within the mold 400. In the present embodiment, in this way, different portions of the component member 300 are held between the first mold part 410 and the second mold part 420 in the overlapping direction of the internal terminal 15a and the second connection terminal 16.

The component member 300 shown in FIG. 22 corresponds to a cross-section taken along a line XXII-XXII in FIG. 21. The component member 300 shown in FIG. 23 corresponds to a cross-section taken along a line XXIII-XXIII in FIG. 21.

Further, in the present embodiment, the first mold part 410 is brought into contact with the portion of the internal terminal 15a to be exposed from the opening portion 193 via a cushioning material 430. In other words, the cushioning material 430 is arranged between the portion of the internal terminal 15a to be exposed from the opening portion 193 and the first mold part 410. Therefore, it is possible to suppress damage to the portion of the internal terminal 15a to be exposed from the opening portion 193. The cushioning material 430 is made of a material softer than the mold 400, such as fluorine resin, fluorine rubber, or silicone rubber.

Next, although not shown, molten resin is injected into the mold 400 and solidified, so the resin molded part 19 having the opening portion 193 is formed. In this case, the internal terminal 15a and the second connection terminal 16 are individually fixed by the mold 400, in the present embodiment. Therefore, it is possible to suppress variation in the distance between the internal terminal 15a and the second connection terminal 16, and to suppress variation in inductance. Further, in the present embodiment, the roughened portion 170 is shallower than the groove portion 160 to reduce the surface roughness. Therefore, for example, as compared with the case where the groove portion 160 is formed entirely in the areas of the internal terminal 15a and the second connection terminal 16 sealed with the resin molded part 19, it is possible to suppress the degradation of the flow of the molten resin. Also, it is possible to suppress occurrence of entrapment voids and the like.

Next, as shown in FIG. 24, the tie bars 210 and the like connecting the control terminals 14 and the internal terminal 15a are cut. As a result, the tie bar remaining portions 15c that connect to the internal terminal 15a and project from the first and second protrusion side surfaces 191d and 191e of the protrusion 191 are provided.

Subsequently, although not shown, the external terminal 15b is bonded to the internal terminal 15a by ultrasonic bonding. In this case, since the tie bar projecting portions 150c project from the resin molded part 19, stress concentration is likely to occur at the boundary between the first and second protrusion side surfaces 191d and 191e and the tie bar projecting portions 150c. In the present embodiment, the groove portion 160 is formed in the portion of the tie bar remaining portion 15c that is sealed with the resin molded part 19. Therefore, when the external terminal 15b is ultrasonically bonded to the internal terminal 15a, the stress can be dispersed, and the stress generated at the boundaries between the first and second protrusion side surfaces 191*d* and 191*e* and the tie bar projecting portions 150*c* can be reduced. For this reason, it is possible to suppress the resin molded part 19 from being broken when the external terminal 15*b* is ultrasonically bonded to the internal terminal 15*a*.

Thereafter, although not shown, the control terminals 14 are bent. Thus, the semiconductor module 6 is produced.

According to the present embodiment described above, the first connection terminal 15 has the groove portion 160 at the position between the portion exposing from the opening portion 193 and the tie bar projecting portion 150*c*. Therefore, when the external terminal 15*b* is ultrasonically bonded to the internal terminal 15*a* in the opening portion 193, the stress can be dispersed. As a result, maximum stress generated at the boundaries between the tie bar projecting portions 150 and the first and second protrusion side surfaces 191*d* and 191*e* can be reduced. Accordingly, damage to the resin molded part 19 can be suppressed. It should be noted that the maximum stress generated at the boundaries between the tie bar projecting portions 150 and the first and second protrusion side surfaces 191*d* and 191*e* can be reduced also by increasing the distance between the portion of the first connection terminal 15 exposing from the opening portion 193 and the tie bar projecting portion 150*c*. However, if the distance between the portion of the first connection terminal 15 exposing from the opening portion 193 and the tie bar projecting portion 150*c* is increased, the size of the semiconductor module 6 in the planar direction increases. On the other hand, by forming the groove portion 160 as in the present embodiment, it is possible to suppress damage to the resin molded part 19 while suppressing an increase in the size of the semiconductor module 6.

(1) In the present embodiment, the groove portion 160 is formed in the tie bar remaining portion 15*c*. That is, the groove portion 160 is formed in the portion of the first connection terminal 15 that is different from the portion through which the current mainly flows. Therefore, it is possible to suppress damage to the resin molded part 19 while suppressing deterioration in current performance.

(2) In the present embodiment, the roughened portions 170 are formed in the portion of the first connection terminal 15 and the portion of the second connection terminal 16, the portions being sealed with the resin molded part 19 and being different from the portions where the groove portion 160 is formed. Therefore, the roughened portion 170 can improve the adhesion with the resin molded part 19. Further, the roughened portion 170 is shallower than the groove portion 160. Therefore, when the molten resin is injected into the mold 400 to form the resin molded part 19, it is possible to suppress the resin flow from being lowered, and to suppress the occurrence of entrapment voids.

(3) In the present embodiment, the groove portion 160 is configured by multiple recesses 161 extending along the second direction. That is, the groove portion 160 is formed by multiple recesses 161 extending in a direction intersecting the direction of vibrations generated when the external terminal 15*b* is ultrasonically bonded. Therefore, vibrations generated during the ultrasonic bonding can be effectively suppressed.

(4) In the present embodiment, the groove portion 160 has the width of 50 μm or more. As a result, the resin molded part 19 can be sufficiently inserted into the groove portion 160. Also, the processing for forming the groove portion 160 by irradiating with the laser beam can be facilitated.

(5) In the present embodiment, the depth of the groove portion 160 is ¹/₁₀ or more of the thickness of the internal terminal 15*a* other than the portion where the groove portion 160 is formed. Therefore, it is possible to easily suppress vibrations generated when ultrasonically bonding the external terminal 15*b* to the internal terminal 15*a*. Further, the thickness of the tie bar remaining portion 15*c* at the position corresponding to the groove portion 160 is ½ or more of the thickness of the tie bar remaining portion 15*c* other than the portion corresponding to the groove portion 160. Therefore, it is possible to suppress the tie bar remaining portion 15*c* from being broken.

(6) In the present embodiment, the first connection terminal 15 and the second connection terminal 16 are arranged in layers, that is, overlapped in the thickness direction. Therefore, the inductance between the first connection terminal 15 and the second connection terminal 16 can be reduced.

OTHER EMBODIMENTS

Although the present disclosure has been described in accordance with the embodiment, it is understood that the present disclosure is not limited to such embodiment or structures. The present disclosure encompasses various modifications and variations within the scope of equivalents. In addition, various combinations and configurations, as well as other combinations and configurations that include only one element, more, or less, are within the scope and spirit of the present disclosure.

For example, in the first embodiment described above, the first connection terminal 15 and the second connection terminal 16 are arranged to overlap with each other. However, the first connection terminal 15 and the second connection terminal 16 may not be arranged so as to overlap with each other. Also, in the first embodiment described above, the semiconductor module 6 exemplarily has the first connection terminal 15 and the second connection terminal 16. However, the semiconductor module 6 may not have the second connection terminal 16.

The semiconductor module 6 of the first embodiment described above may be applied to construct a circuit other than the three-phase inverter circuit. Also, the number of semiconductor chips 10 sealed in the resin molded part 19 can be changed as appropriate.

In addition, in the first embodiment described above, the method of connecting the semiconductor chips 101 to 106 and the first and second connection terminals 15 and 16 can be changed as appropriate.

In the first embodiment described above, the roughened portion 170 may not be formed.

In the first embodiment described above, the groove portion 160 may be formed in the internal terminal 15*a* instead of being formed in the tie bar remaining portion 15*c*.

The groove portion 160 may be formed on one of the first main surface 150*a* and the second main surface 150*b* of the tie bar remaining portion 15*c*, instead of being formed on both the first main surface 150*a* and the second main surface 150*b* of the tie bar remaining portion 15*c*.

Further, the recesses 161 of the groove portion 160 may extend in directions different from the second direction as long as the extension directions of the recesses 161 intersect with the direction of vibrations generated when the outer terminal 15*b* is ultrasonically bonded to the internal terminal 15*a*.

The width of the groove portion 160 may be 50 μm or less. Furthermore, the depth of the groove portion 160 may be less than 1/10 of the thickness of the tie bar remaining portion 15c. Alternatively, the depth of the groove portion 160 may be adjusted so that the thickness of the tie bar remaining portion 15c where the groove portion 160 is formed is ½ or less of the thickness of the tie bar remaining portion 15c.

In the first embodiment described above, the resin molded part 19 may not be provided with the protrusion 191. For example, the semiconductor module 6 may be configured such that the second connection terminals 16 project from the third side surface 19e of the resin molded part 19 and the internal terminals 15a are exposed from the second surface 19b of the resin molded part 19.

In the first embodiment described above, the roughened portion 170 may not be formed. Further, when forming the roughened portion 170, the roughened portion 170 may be formed using a laser device different from the laser device for forming the groove portion 160. As another example, the roughened portion 170 may be formed by another method such as blasting.

What is claimed is:

1. A semiconductor module comprising:
a semiconductor chip;
a resin molded part that seals the semiconductor chip; and
a connection terminal that is electrically connected to the semiconductor chip, wherein
the connection terminal includes an internal terminal having a plate shape, an external terminal, and a tie bar remaining portion,
the internal terminal is extended in a first direction along a planar direction and sealed in the resin molded part, and the internal terminal is exposed from an opening portion provided in the resin molded part,
the external terminal is connected to the internal terminal at the opening portion, and projected outside the resin molded part,
the tie bar remaining portion extends from the internal terminal in a second direction that intersects the first direction and along the planar direction of the internal terminal, and projects outside the resin molded part to provide a tie bar projecting portion,
the connection terminal has a groove portion at a position between a portion of the internal terminal exposed from the opening portion and the tie bar projecting portion,
the resin molded part is received in the groove portion, and
the groove portion has an opening edge portion adjacent to the tie bar projecting portion, and is covered with the resin molded part together with the opening edge portion.

2. The semiconductor module according to claim 1, wherein
the groove portion is disposed in the tie bar remaining portion.

3. The semiconductor module according to claim 1, wherein
the connection terminal has a roughened portion at a position that is different from the groove portion and is sealed with the resin molded part, and
the groove portion has a surface roughness larger than that of the roughened portion.

4. The semiconductor module according to claim 1, wherein
the groove portion includes a plurality of recesses, and the plurality of recesses extends in a direction that intersects the second direction.

5. The semiconductor module according to claim 1, wherein
the groove portion has a width of 50 micrometers or more in the second direction.

6. The semiconductor module according to claim 1, wherein
the groove portion has a depth of 1/10 or more of a thickness of a portion of the connection terminal different from a portion where the groove portion is provided, and
a thickness of the portion of the connection terminal where the groove portion is provided is ½ or more of the thickness of the portion of the connection terminal different from the portion where the groove portion is provided.

7. The semiconductor module according to claim 1, wherein
the connection terminal is a first connection terminal,
the semiconductor module further comprising:
a second connection terminal that has a plate shape, and is electrically connected to the semiconductor chip, wherein
the first connection terminal and the second connection terminal are arranged to overlap with each other across a predetermined distance in a thickness direction perpendicular to the planar direction,
the second connection terminal has a portion projecting from a predetermined surface of the resin molded part, and
the resin molded part has the opening portion defining an opening from which the internal terminal of the first connection terminal is exposed on a surface different from the predetermined surface.

8. A method for manufacturing a semiconductor module, the semiconductor module including:
a semiconductor chip;
a resin molded part that seals the semiconductor chip; and
a connection terminal that is electrically connected to the semiconductor chip, wherein
the connection terminal includes an internal terminal having a plate shape, an external terminal, and a tie bar remaining portion,
the internal terminal is extended in a first direction along a planar direction and sealed in the resin molded part, and the internal terminal is exposed from an opening portion provided in the resin molded part,
the external terminal is connected to the internal terminal at the opening portion, and projected outside the resin molded part,
the tie bar remaining portion extends from the internal terminal in a second direction that intersects the first direction and along the planar direction of the internal terminal, and projects outside the resin molded part to provide a tie bar projecting portion,
the connection terminal has a groove portion at a position between a portion of the internal terminal exposed from the opening portion and the tie bar projecting portion,
the resin molded part is received in the groove portion, and
the groove portion has an opening edge portion adjacent to the tie bar projecting portion, and is covered with the resin molded part together with the opening edge portion,
the method comprising:
preparing a terminal constituent member having the internal terminal and a tie bar integral with the internal terminal;

forming the groove portion in a portion of at least one of the internal terminal and the tie bar, which is to be sealed with the resin molded part;

forming a component member from the terminal constituent member by electrically connecting the internal terminal to the semiconductor chip;

placing the component member in a cavity of a mold, the cavity being provided by engaging a first mold part and a second mold part of the mold with each other;

forming the resin molded part by injecting a molten resin into the cavity of the mold and solidifying the molten resin;

cutting the tie bar so that the tie bar remaining portion extending from the internal terminal and including the tie bar projecting portion projecting from the molded resin is formed; and ultrasonically bonding the external terminal to the internal terminal.

9. The method according to claim 8, further comprising:

forming a roughened portion in a portion of at least one of the internal terminal and the tie bar, which is to be sealed with the resin molded part and is different from the groove portion, the roughened portion having a surface roughness smaller than that of the groove portion, and in the forming of the groove portion and in the forming of the roughened portion, the groove portion and the roughened portion are formed by applying laser beams using a same laser device.

\* \* \* \* \*